(12) United States Patent
Yamaji

(10) Patent No.: US 10,192,870 B2
(45) Date of Patent: Jan. 29, 2019

(54) SEMICONDUCTOR DEVICE

(71) Applicant: Fuji Electric Co., Ltd., Kanagawa (JP)

(72) Inventor: Masaharu Yamaji, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/831,778

(22) Filed: Dec. 5, 2017

(65) Prior Publication Data
US 2018/0204841 A1 Jul. 19, 2018

(30) Foreign Application Priority Data

Jan. 19, 2017 (JP) .................................. 2017-007549

(51) Int. Cl.
| | |
|---|---|
| *H01L 27/092* | (2006.01) |
| *H01L 27/02* | (2006.01) |
| *H01L 29/10* | (2006.01) |
| *H01L 29/423* | (2006.01) |
| *H01L 29/78* | (2006.01) |
| *H01L 21/761* | (2006.01) |
| *H01L 21/8234* | (2006.01) |
| *H01L 29/06* | (2006.01) |

(52) U.S. Cl.
CPC ........ *H01L 27/0928* (2013.01); *H01L 21/761* (2013.01); *H01L 21/823481* (2013.01); *H01L 27/0255* (2013.01); *H01L 27/0288* (2013.01); *H01L 29/0692* (2013.01); *H01L 29/1083* (2013.01); *H01L 29/1087* (2013.01); *H01L 29/4238* (2013.01); *H01L 29/7817* (2013.01); *H01L 29/7824* (2013.01)

(58) Field of Classification Search
CPC ............. H01L 27/0928; H01L 27/0255; H01L 27/0288; H01L 21/761; H01L 21/823481; H01L 29/0692; H01L 29/1083; H01L 29/1087; H01L 29/4238; H01L 29/7817; H01L 29/7824

USPC ................................ 257/369, 500, 501, 502
See application file for complete search history.

(56) References Cited

U.S. PATENT DOCUMENTS

| | | | |
|---|---|---|---|
| 6,597,550 B1 * | 7/2003 | Chey | ................... H01L 27/0255 257/536 |
| 2010/0314710 A1 * | 12/2010 | Yamaji | ................... H01L 24/05 257/501 |

FOREIGN PATENT DOCUMENTS

| | | |
|---|---|---|
| JP | 3900178 B2 | 4/2007 |
| JP | 5530669 B2 | 6/2014 |

* cited by examiner

Primary Examiner — Cuong Q Nguyen
Assistant Examiner — Tong-Ho Kim
(74) Attorney, Agent, or Firm — Chen Yoshimura LLP

(57) ABSTRACT

An HVNMOS having a source follower configuration is disposed in an n⁻ diffusion region that forms an HVJT. The lateral HVNMOS includes a p-type back gate region, source contact region, n⁺drain region, and gate electrode. The p-type back gate region and source contact region contact a p⁻ isolation region and are separated from p⁺ common potential regions inside the p⁻ isolation region. The source contact region is electrically connected to the COM electrode pad through a source follower resistor $R_{SF}$. The p⁺ common potential regions are electrically connected to the p-type back gate region and source contact region of the HVNMOS through diffusion resistors provided between the p-type back gate region/source contact region of the HVNMOS and the p⁺ common potential region.

20 Claims, 16 Drawing Sheets

SEMICONDUCTOR DEVICE

BACKGROUND OF THE INVENTION

Technical Field

The present invention relates to a semiconductor device.

Background Art

In conventional high voltage integrated circuits (HVICs), there is an element isolation scheme that uses a high withstand voltage junction to electrically isolate a high potential side (high side) region from a low potential side (low side) region both disposed on the same semiconductor chip with a high voltage junction termination region (HVJT) disposed between these regions.

The HVIC is used as a gate driver IC for driving a power device, and the HVJT has a high withstand voltage n-channel MOSFET (metal oxide semiconductor field effect transistor; hereinafter, "HVNMOS") that functions as a level shift device of the HVIC. Signals are transmitted between the high potential region and low potential region via the level shift device.

In regard to HVICs, a device has also been proposed where the level shift device, which is an interface device, has a source follower configuration in which an element such as a resistor or a bipolar device is connected between the source of the level shift device and a common potential COM (a potential on the negative electrode side of the main DC power supply) (e.g., see Patent Document 1 and Patent Document 2 below). Forming the level shift device to be a source follower configuration reduces current, increases speed, prevents heat generation (reduces loss), stabilizes signal transmission, etc. in the level shift device. A circuit configuration of a conventional HVIC will be described below.

FIG. 5 is a circuit diagram showing a circuit configuration of an HVIC in which a conventional level shift device is embedded. FIG. 6 is a characteristics diagram showing voltage/current characteristics of the level shift device in FIG. 5. FIGS. 5 and 6 are FIGS. 5 and 6 of Patent Document 1 below. The conventional HVIC 100 in FIG. 5 is a gate driver IC that drives an IGBT 121 on the high potential side (upper arm) among IGBTs 121 and 122 of a bridge circuit 120 that together form a single phase, for example. The bridge circuit 120 is connected in series between a potential (power supply potential) Vdc of the positive electrode side of the main DC power supply and the common potential COM, which is the negative electrode side.

The reference character OUT is a node shared by the emitter of the IGBT 121 on the upper arm of the bridge circuit 120 and the collector of the IGBT 122 on the low potential side (lower arm) and is an AC output terminal of the bridge circuit 120. The HVNMOSes (level shift devices) 101, 102, load resistors (resistors) 103, 104, constant voltage diodes 105, 106, NOT circuits 107, 108, RS flip-flop (RS-FF) 109, high potential side circuit unit 110, and auxiliary DC power supply E1 all constitute a level shift circuit for driving the IGBT 121 on the upper arm of the bridge circuit 120. The reference character Vcc1 is the potential (the highest potential in the HVIC 100) of the positive electrode line of the auxiliary DC power supply E1 on the high potential side.

The HVNMOS 101 becomes conductive by receiving an ON signal 131 of a pulse created by a control circuit (not shown), and the IGBT 121 is turned ON by using the voltage drop of the load resistor 103 caused by conduction of the HVNMOS 101 as a signal. The HVNMOS 102 becomes conductive by receiving an OFF signal 132 of a pulse created by the control circuit, and the IGBT 121 is turned OFF by using the voltage drop of the load resistor 104 caused by conduction of the HVNM 102 as a signal. The control circuit is supplied with current from a potential Vcc2 of the positive electrode line of the auxiliary DC power supply E2 on the low potential side, which references the common potential COM.

In the level shift circuit, the two HVNMOSes 101 and 102 serve as a circuit section that inputs a signal referenced to the common voltage COM to subsequent stages (to the NOT circuits 107 and 108). The HVNMOS 101 & HVNMOS 102, and the load resistor 103 & load resistor 104, are normally respectively configured to be equal to each other. The HVNMOSes 101 and 102 are respectively connected to resistors for current negative feedback (hereinafter, "current negative feedback resistors") 111 and 112 between the source and common potential COM, thus forming a source follower configuration.

In this manner, the HVNMOSes 101 and 102 can be set to a source follower configuration by inserting the current negative feedback resistors 111 and 112 between the sources of the HVNMOSes 101 and 102 and the common potential COM. Moreover, the voltage applied between the gates of the HVNMOSes 101, 102 and the common potential COM is set to a voltage that is lower than the auxiliary DC power supply E1, which supplies the lowest voltage of the load resistors 103, 104 side power supply in the HVNMOSes 101, 102. This improves constant current characteristics for the drain current of the HVNMOSes 101, 102 and makes it possible to keep voltage drops at the current feedback resistors 111, 112 to be small.

By keeping the voltage drops at the current feedback resistors 111, 112 to be small, the drain current of the HVNMOSes 101, 102 becomes smaller and fluctuations in the drain current of the HVNMOSes 101, 102 also become smaller, regardless of the drain/source voltage (voltage between drain and source) of the HVNMOSes 101, 102. Thus, it is possible to keep the voltage drops of the load resistors 103, 104 at a suitable level and to stably transmit signals regardless of fluctuations in the internal potential of the HVIC 100 toward the high potential side or toward the low potential side. This also makes it possible to reduce the power consumption of the level shift circuit.

The operation of the level shift circuit of the HVIC 100 shown in FIG. 5 will be described with reference to FIG. 6. Reference character 141 in FIG. 6 represents the relationship between the drain/source voltage $V_{DS}$ and the drain current $I_D$ of the individual HVNMOSes 101, 102. The reference character 142 in FIG. 6 represents the relationship between the drain/source voltage $V_{DS}$ and the drain current $I_D$ of the individual HVNMOSes 101, 102 when the current feedback resistors 111, 112 are inserted between the sources of the HVNMOSes 101, 102 and the common potential COM.

In the HVIC 100, when the MOSFETs 101, 102 are electrically connected in response to the inputs of the ON signal 131 and OFF signal 132, respectively, the voltage drop at the current feedback resistors 111, 112 due to the drain current $I_D$ causes a reduction in the gate/source voltage of the HVNMOSes 101, 102. The voltage drop of the current feedback resistors 111, 112 will not exceed a voltage value obtained by subtracting the gate threshold voltage of the HVNMOSes 101, 102 from the gate voltage (the Zener voltage of the fixed voltage diodes 113, 114); thus, negative feedback is applied to the drain current $I_D$ of the MOSFETs 101, 102.

The application of the negative feedback to the drain current $I_D$ of the MOSFETs 101, 102 results in voltage/current characteristics 142 with a wide constant current region, as shown in FIG. 6. This reduces the difference between the drain current $I_L$ determined by a load straight line 143 of the load resistor 103 or load resistor 104 when the potential of the AC output terminal OUT is close to the common potential COM and the drain current $I_H$ determined by a load straight line 144 of the load resistor 103 or load resistor 104 when the potential of the AC output terminal OUT is close to the power supply potential Vdc of the bridge circuit 120, thus preventing an increase in loss in the level shift circuit.

FIG. 7 is a circuit diagram showing another example of a circuit configuration of an HVIC in which a conventional level shift device is embedded. FIG. 7 is FIG. 3 of Patent Document 2. An HVIC 150 shown in FIG. 7 includes an n-channel MOSFET 151, a current mirror circuit 152, and a high potential side circuit unit 153. The n-channel MOSFET 151 is connected between an internal node 154 and the common potential COM. The current mirror circuit 152 causes a current to flow that corresponds to the current supplied from current supplying units 155, 156.

The high potential side circuit unit 153 generates a voltage signal corresponding to the current flowing through the current mirror circuit 152 and generates a gate driving signal for an upper arm IGBT 121. The current mirror circuit 152 includes an HVNMOS 157 and bipolar transistors 158, 159. The gate of the HVNMOS 157 is connected to an internal node 154 and the drain of the HVNMOS 157 is connected to an AC output terminal OUT. Furthermore, the bipolar transistor 158 is connected between the source of HVNMOS 157 and the common potential COM, thereby forming a source follower configuration.

The HVNMOS 157 prevents a high voltage from being supplied to the bipolar transistors 158, 159 caused by the drain voltage becoming higher than the gate voltage by operating in source follower mode. The HVNMOS 157 is a level shift device that draws out, from the high potential side circuit unit 153, a current equivalent to a current Jr supplied from the current supplying units 155, 156. The reference character HIN is a pulse signal for controlling ON/OFF of the upper arm IGBT 121. The reference character LIN is a pulse signal for controlling ON/OFF of the lower arm IGBT 122.

As shown by HVICs 100, 150 in FIGS. 5 and 7, making the level shift device HVNMOS into a source follower configuration makes it possible to reduce the saturation current (drain current) of the HVNMOS and stabilize current more than if nothing were connected between the source of the HVNMOS and the common potential COM. This also suppresses variation in the saturation current of the HVNMOS caused by process variation (e.g., variations in the thickness of the gate insulating film, or the like) and makes it possible to have a stable level shift operation.

As another example of an HVIC, a device has been proposed in which a resistor is connected in series to an internal parasitic diode of the HVIC chip between an anode of the internal parasitic diode and the common potential COM (e.g., see Patent Document 3 below). In Patent Document 3 below, when the potential of a node shared by an upper arm IGBT and a lower arm IGBT in a bridge circuit becomes too negative, the forward current of the internal parasitic diode inside the HVIC chip is inhibited by the resistor in order to protect the HVIC chip. The resistor is made of a polysilicon layer and is provided on the HVIC chip with an insulating layer between the chip and the resistor.

The structure of a conventional HVIC 100 and structures of HVNMOSes 101, 102 will be described with reference to FIGS. 8 and 9. FIG. 8 is a plan view showing a planar layout of a conventional semiconductor device. The planar layout is the planar shape and arrangement configuration as seen from the front surface side of the semiconductor substrate (semiconductor chip) 160. FIG. 9 is a perspective view showing a cross-sectional structure of FIG. 8 of the rectangular box AA. FIG. 9 shows the HVNMOS 101, which forms a set level shift circuit for the high potential side circuit unit shown in FIG. 8.

The conventional semiconductor device shown in FIG. 8 is an HVIC 100 that includes a high potential side region 171 and a low potential side region 172 on the same semiconductor substrate 160, and these regions are electrically isolated from each other by an HVJT 173. An n⁻ diffusion region 162 and p⁻ isolation region 164 are each selectively provided in the front surface layer of the p⁻⁻ semiconductor substrate 160 (see FIG. 9). The p⁻ isolation region 164 is a diffusion region. Hereinafter, all portions of the p⁻⁻ semiconductor substrate 160 besides the n⁻ diffusion region 162 and p⁻ isolation region 164 are assumed to be a p⁻⁻ substrate region 161.

The high potential side region 171 is made of an n-type diffusion region 163 arranged in a roughly square shaped planar layout inside then diffusion region 162. The p⁻ isolation region 164 is arranged in an annular planar layout contacting the n⁻ diffusion region 162 and p⁻⁻ substrate region 161 and surrounding then diffusion region 162. The HVJT 173 is made of a parasitic diode formed by the pn junction of the p⁻ isolation region 164 and n⁻ diffusion region 162. A p⁺ contact region 165 is selectively arranged in an annular planar layout surrounding the n⁻ diffusion region 162 inside the p⁻ isolation region 164.

The p⁺ contact region 165 is electrically connected to an electrode pad 191 of a common potential COM (hereinafter, "COM electrode pad"), and the p⁻ isolation region 164 and p⁻⁻ substrate region 161 are fixed to the common potential COM. The low potential side region 172 is made of an n-type diffusion region 166 selectively provided in the p⁻⁻ substrate region 161. The n-type diffusion region 166 is disposed on the side opposite to the n-type diffusion region 163 with respect to the p⁻ isolation region 164 and is electrically insulated from the n-type diffusion region 163 by the p⁻ isolation region 164.

The HVNMOSes 101, 102 forming the set and reset level shift circuits of the high potential side circuit unit of the HVIC 100 are arranged in the HVJT 173. As shown in FIG. 9, the HVNMOS 101 includes a p-type diffusion region (hereinafter, "p-type back gate region") 181 serving as the back gate, an n⁺ source region 182, a p⁺ contact region 183, an n⁺ drain region 184, and a gate electrode 185. The p-type back gate region 181 and n⁺ drain region 184 are selectively provided inside then diffusion region 162. The depth of the p-type back gate region 181 is less than the depth of then diffusion region 162.

The p-type back gate region 181 is separated from the p⁻ isolation region 164 and formed closer to the n-type diffusion region 163 side than is the p⁻ isolation region 164 is. The n⁺ drain region 184 is separated from the p-type back gate region 181 and disposed closer to the n-type diffusion region 163 side than is the p-type back gate region 181. The n⁺ source region 182 and p⁺ contact region 183 are selectively provided inside the p-type back gate region 181. The n⁺ source region 182 and p⁺ contact region 183 are electrically connected to the COM electrode pad 191 via a resistor $R_{SF}$. The resistor $R_{SF}$ corresponds to the current feedback resistor shown in FIG. 5.

Then diffusion region 162 electrically isolates the p-type back gate region 181 and the n⁺ source region 182 of the HVNMOS 101 from the region fixed to the common potential COM (the p⁻⁻ substrate region 161 and p⁻ isolation region 164). Due to this, the source potential of the HVNMOS 101 is electrically isolated from the common potential COM. Furthermore, a resistive element such as the resistor (hereinafter, source follower resistor) $R_{SF}$ is connected between the regions electrically isolated by then diffusion region 162. This gives the HVNMOS 101 a source follower configuration. The configuration of the HVNMOS 102 is the same as the HVNMOS 101.

Due to the p-type back gate region 181 being electrically isolated from the region fixed to the common potential COM, the potential of the p-type back gate region 181 can be fixed to a potential other than the common potential COM. Furthermore, even if the drain of the HVNMOS 101 were to be brought up to a high voltage of several hundred volts due to the switching of the IGBTs 121 and 122 forming the bridge circuit, the portion of the n⁻ diffusion region 162 sandwiched by the p-type back gate region 181 and p⁻ substrate region 161 would deplete and ensure an adequate withstand voltage.

RELATED ART DOCUMENTS

Patent Documents

Patent Document 1: Japanese Patent No. 3900178
Patent Document 2: Japanese Patent No. 5530669
Patent Document 3: U.S. Pat. No. 6,597,550 Specification

SUMMARY OF THE INVENTION

However, if an HVNMOS with a source follower configuration is isolated from other elements by a self-isolating structure, a pn junction isolating structure, or the like, a parasitic structure will be formed inside the semiconductor substrate (semiconductor chip). Thus, there is a risk that unintended parasitic current will make current control of the source follower HVNMOS impossible. For example, if the HVNMOS 101 on the semiconductor substrate 160 were isolated from other elements by a self-isolating structure (see FIGS. 8 and 9), the following parasitic operation would occur.

When the HVNMOS 101 is ON and the drain current of the HVNMOS 101 is suppressed by the voltage drop at the current feedback resistor 111, the potential of the n⁺ source region 182 and p-type back gate region 181 of the HVNMOS 101 would become higher by 0.6 V or more than the potential of the portion of then diffusion region 162 directly below the p-type back gate region 181 (the portion sandwiched by the p-type back gate region 181 and the p⁻⁻ substrate region 161).

In such a case, a pnp parasitic bipolar transistor 192 made of the p-type back gate region 181, n⁻ diffusion region 162, p⁻⁻ substrate region 161, and p⁻ isolation region 164 would operate with respect to the p⁻⁻ substrate region 161. Due to this, there would be a risk that the impedance between the n⁺ source region 182 of the HVNMOS 101 and the common potential COM becomes very low and that the drain current stabilization effects of the source follower configuration HVNMOS 101 would be lost.

In order to solve the problems associated with the conventional technology described above, the present invention aims at providing a semiconductor device that can perform stable level shift operations. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides: a semiconductor device, including a semiconductor substrate of a first conductivity type; a first semiconductor region of a second conductivity type, selectively provided in one main surface of the semiconductor substrate; an isolating structure formed by a pn junction of the semiconductor substrate and the first semiconductor region, the isolating structure isolating regions of differing potentials; a semiconductor element having: a second semiconductor region of the second conductivity type, selectively provided in the one main surface of the semiconductor substrate so as to be separated from the first semiconductor region and electrically connected to an electrode of a minimum potential through a first resistor; a third semiconductor region of the second conductivity type selectively provided inside the first semiconductor region and having a higher impurity concentration than the first semiconductor region; a gate insulating film provided along the semiconductor substrate between the first semiconductor region and the second semiconductor region; and a gate electrode provided along the gate insulating film, the semiconductor element converting a signal referenced to the minimum potential into a signal referenced to a potential differing from the minimum potential; and a fourth semiconductor region of the first conductivity type selectively provided in the one main surface of the semiconductor substrate so as to be separated from the second semiconductor region at a prescribed distance and electrically connected to the electrode of the minimum potential, the fourth semiconductor region having a higher impurity concentration than the semiconductor substrate, wherein the second semiconductor region is electrically connected to the fourth semiconductor region through a second resistor, and wherein the second resistor includes a portion of the semiconductor substrate between the second semiconductor region and the fourth semiconductor region.

The above-mentioned semiconductor device may further include: a fifth semiconductor region of the first conductivity type, selectively provided in the one main surface of the semiconductor substrate and contacting the first semiconductor region, the fifth semiconductor region having a higher impurity concentration than the semiconductor substrate, wherein the isolating structure is formed by a pn junction of the fifth semiconductor region and the first semiconductor region, wherein the second semiconductor region and the fourth semiconductor region are provided inside the fifth semiconductor region, wherein the gate insulating film is provided along the fifth semiconductor region between the first semiconductor region and the second semiconductor region, and wherein the second resistor includes a portion of the fifth semiconductor region between the second semiconductor region and the fourth semiconductor region.

The above-mentioned semiconductor device may further include a back-gate region of the first conductivity type, selectively provided inside the first semiconductor region and contacting a portion of the semiconductor substrate between the second semiconductor region and the fourth semiconductor region, the back-gate region having a higher impurity concentration than the semiconductor substrate, wherein the second semiconductor region is provided inside the back-gate region and contacts a portion of the semiconductor substrate between the second semiconductor region and the fourth semiconductor region, and wherein the gate insulating film is provided along the back-gate region between the first semiconductor region and the second semiconductor region.

The above-mentioned semiconductor device may further include a back-gate region of the first conductivity type, selectively provided inside the first semiconductor region and contacting a portion of the fifth semiconductor region between the second semiconductor region and the fourth semiconductor region, the back-gate region having a higher impurity concentration than the fifth semiconductor region, wherein the second semiconductor region is provided inside the back-gate region and contacts a portion of the fifth semiconductor region between the second semiconductor region and the fourth semiconductor region, and wherein the gate insulating film is provided along the back-gate region between the first semiconductor region and the second semiconductor region.

The above-mentioned semiconductor device may further include a diffusion region of the second conductivity type, selectively provided in a portion of the semiconductor substrate between the second semiconductor region and the fourth semiconductor region. The above-mentioned semiconductor device may further include a diffusion region of the second conductivity type, selectively provided in a portion of the fifth semiconductor region between the second semiconductor region and the fourth semiconductor region.

The above-mentioned semiconductor device may further include a diffusion region of the second conductivity type, selectively provided in a portion of the semiconductor substrate between the second semiconductor region and the fourth semiconductor region, the diffusion semiconductor region being electrically connected to the back-gate region.

The above-mentioned semiconductor device may further include a diffusion region of the second conductivity type, selectively provided in a portion of the fifth semiconductor region between the second semiconductor region and the fourth semiconductor region.

The above-mentioned semiconductor device may further include a diffusion region of the second conductivity type, selectively provided in a portion of the fifth semiconductor region between the second semiconductor region and the fourth semiconductor region, the diffusion semiconductor region being electrically connected to the back-gate region.

In the above-mentioned semiconductor device, a potential of the diffusion region may be a floating potential or a power supply potential.

In the above-mentioned semiconductor device, the first resistor may be a resistive element connected in parallel to the second resistor.

In the above-mentioned semiconductor device, a resistance of the second resistor may be higher than a resistance of the first resistor.

In the above-mentioned semiconductor device, the second resistor may be used as the first resistor.

In the above-mentioned semiconductor device, the semiconductor element may be disposed along the pn junction that forms the isolating structure, and wherein, in the one main surface of the semiconductor substrate, the fourth semiconductor region does not face the second semiconductor region in a direction perpendicular to a pn junction interface of the pn junction that forms the isolating structure along which the semiconductor element is disposed.

The invention described above does not form a parasitic structure inside the semiconductor substrate, even if the semiconductor substrate has elements isolated via a self-isolating structure, pn junction isolating structure, or the like. Due to this, it is possible to stabilize the current control effects (drain current stabilization) of the source follower configuration HVNMOS.

The semiconductor device of the present invention makes it possible to perform stable level shift operations. It is to be understood that both the foregoing general description and the following detailed description are exemplary and explanatory, and are intended to provide further explanation of the invention as claimed.

DETAILED DESCRIPTION OF EMBODIMENTS

Figure 1:
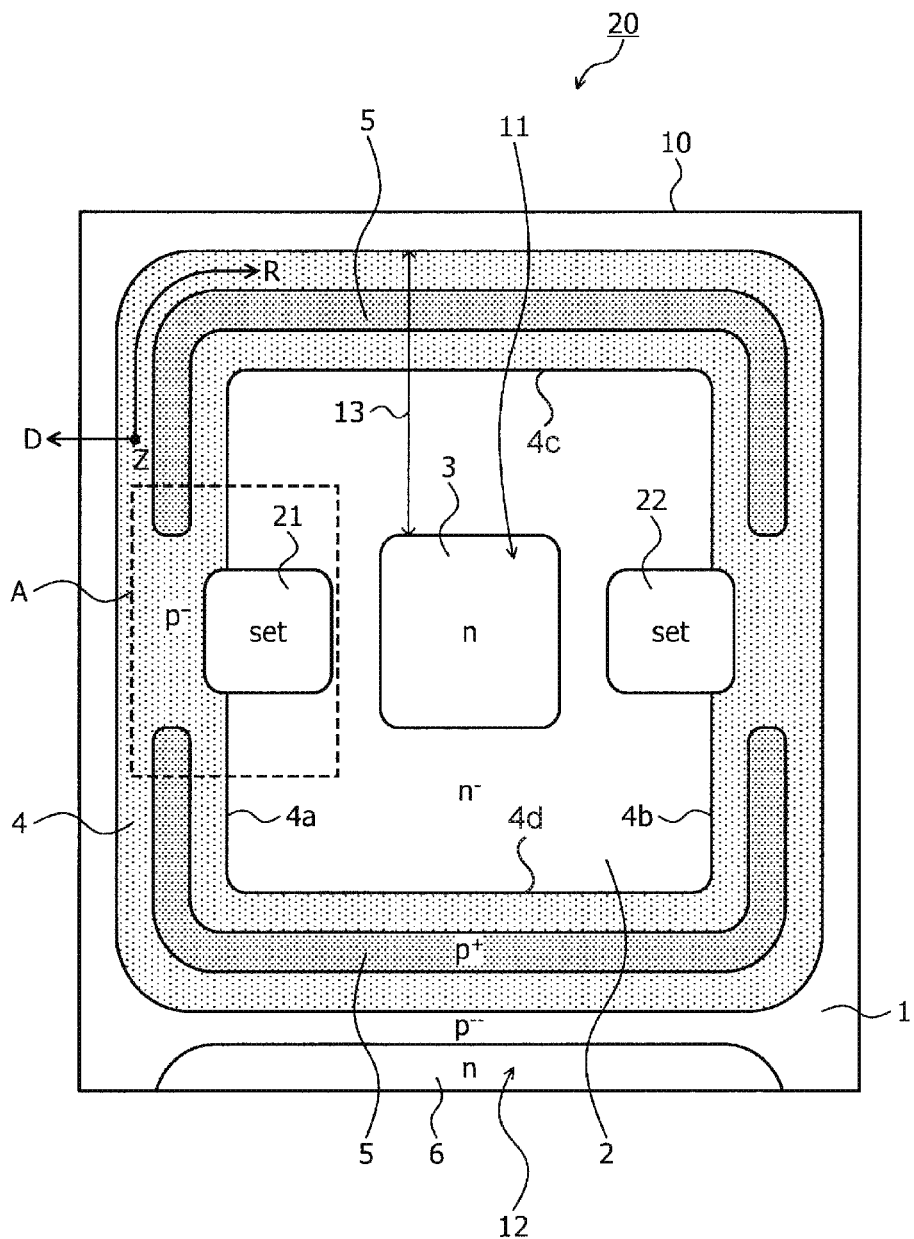
FIG. 1 is a plan view of the planar layout of the semiconductor device of Embodiment 1.

Preferred embodiments of a semiconductor device according to the present invention will be described in detail below with reference to the attached drawings. In the present specification and attached drawings, electrons or holes in layers or areas marked with an "n" or "p" signify majority carriers. The "+" or "−" attached to the "n" or "p" respectively signify higher impurity concentrations and lower impurity concentrations than layers or areas without these marks. In the explanation of the embodiments below and the attached drawings, the same reference characters are attached to similar configurations, and repetitive descriptions thereof will be omitted.

Embodiment 1

Figure 2A:
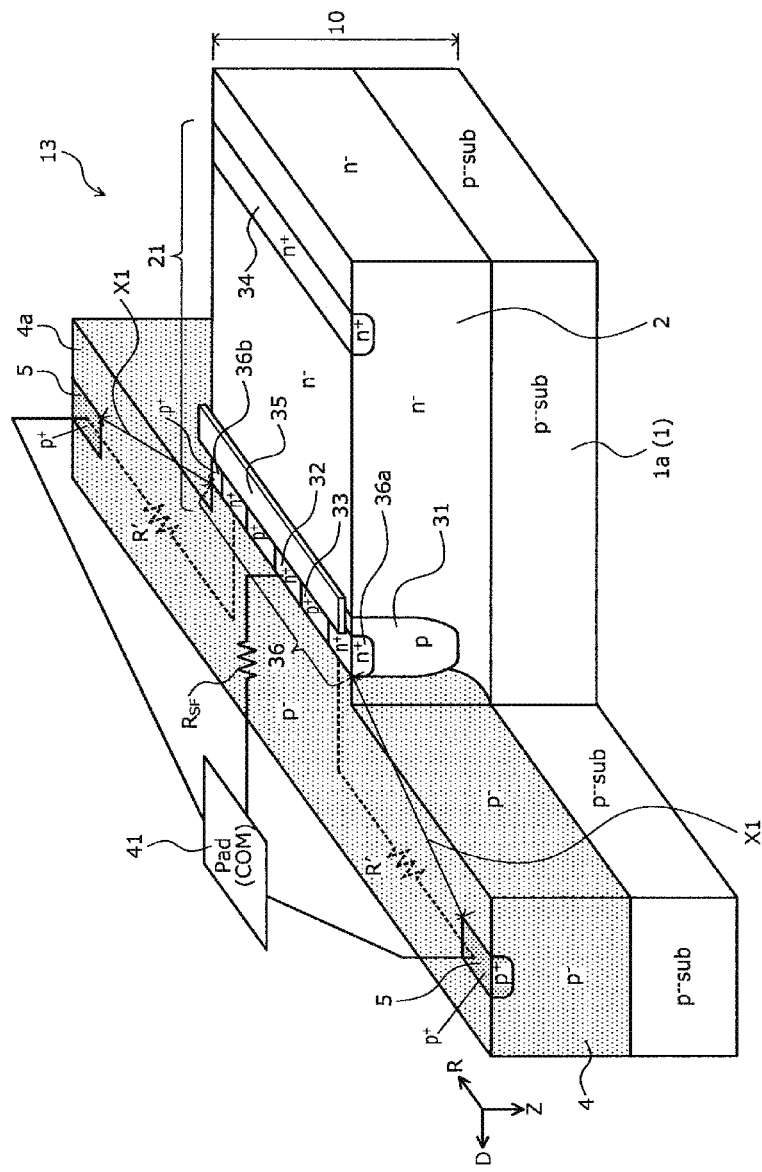
FIG. 2A is a perspective view of a cross-sectional structure of the rectangular box A in FIG. 1.

The structure of a semiconductor device of Embodiment 1 will be described with reference to FIGS. 1, 2A, and 5. FIG. 1 is a plan view of the planar layout of the semiconductor device of Embodiment 1. The planar layout is the plan view shape and arrangement configuration as seen from the front surface side of the semiconductor substrate (semiconductor chip) 10. FIG. 2A is a perspective view of a cross-sectional structure of the rectangular frame A in FIG. 1. FIG. 2A shows the HVNMOS 21, which forms the set level shift circuit for the high potential side circuit unit as shown in FIG. 1.

As shown in FIGS. 1 and 2A, the semiconductor device of Embodiment 1 is a high voltage integrated circuit device (HVIC) 20 that includes a high potential side region 11 and low potential side region 12 on the same semiconductor substrate 10, and these regions are electrically isolated by a high voltage junction termination region (HVJT) 13. The HVIC 20 is a gate driver IC that drives an IGBT 121 on the upper arm (high potential side) among IGBTs 121 and 122 of a bridge circuit 120 for power conversion that together form a single phase, for example.

Figure 5:
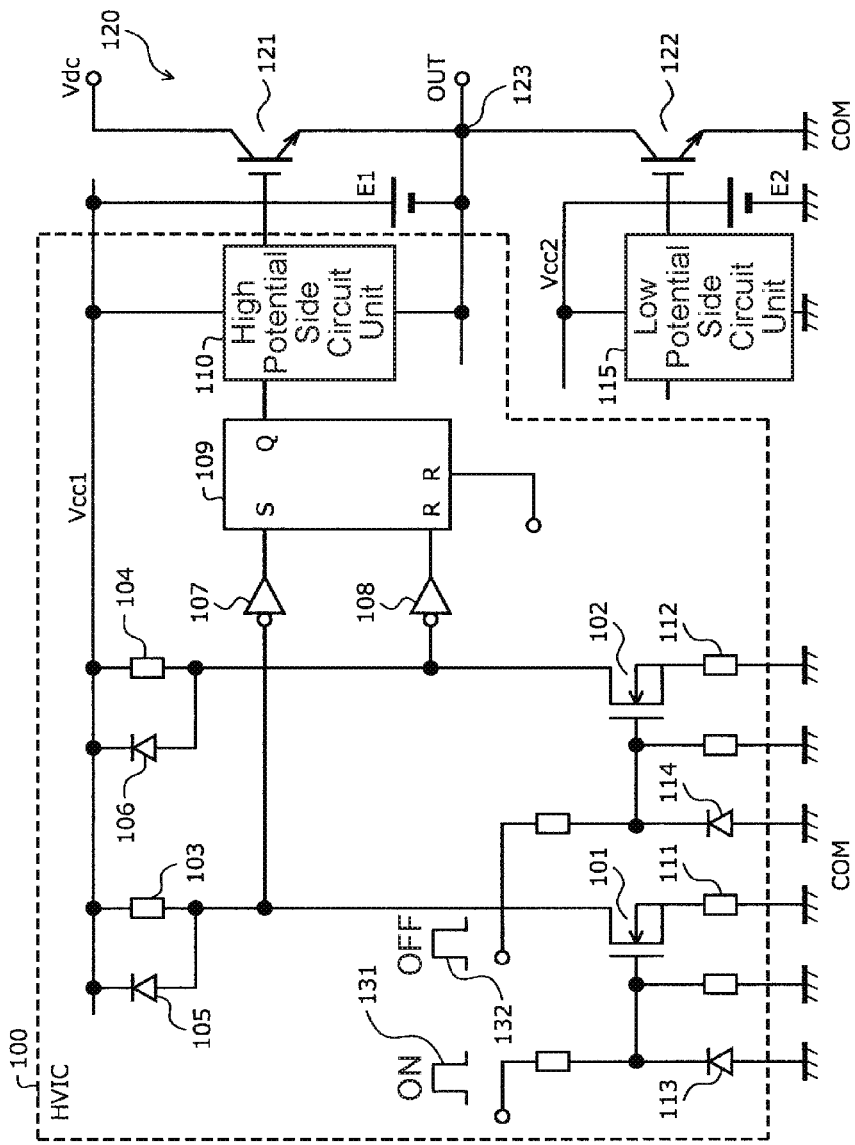
FIG. 5 is a circuit diagram showing a circuit configuration of an HVIC in which a conventional level shift device is embedded.

A circuit configuration example to which the semiconductor device of Embodiment 1 is applied would be a configuration having the HVIC 20 and HVNMOSes 21, 22 of FIGS. 1 and 2A in place of HVIC 100 and HVNMOSes 101, 102, respectively, shown in FIG. 5. In other words, a power conversion device, for example, in which the semiconductor device of Embodiment 1 has been applied would have a circuit configuration having reference characters 20 to 22 instead of reference characters 100 to 102, respectively, in FIG. 5. The switching devices constituting the bridge circuit 120 may be two MOSFETs connected in series instead of the IGBTs 21, 22.

An n⁻ diffusion region (first semiconductor region) 2 and p⁻ isolation region (fifth semiconductor region) 4 are each selectively disposed on a p⁻⁻ semiconductor substrate 10 to form a self-isolating structure. The p⁻ isolation region 4 is a p⁻ diffusion region. Hereinafter, the portion of the p⁻⁻ semiconductor substrate 10 where the diffusion regions 2, 4 are not formed will be referred to as the p⁻⁻ substrate region 1. In FIG. 2A, the p⁻⁻ substrate region 1 is shown as "p⁻⁻ sub" (this is the same for FIGS. 2B-2E). The semiconductor substrate 10 has a generally rectangular shape in a plan view, for example. The n⁻ diffusion region 2 is disposed in a generally rectangular planar layout, for example.

An n-type diffusion region 3 is disposed in a generally rectangular planar layout on the n⁻ diffusion region 2, for example. The p⁻ isolation region 4 contacts the n⁻ diffusion region 2 and p⁻⁻ substrate region 1 and is disposed in an annular planar layout that surrounds the n⁻ diffusion region 2. FIG. 1 shows a state in which the p⁻ isolation region 4 surrounds the n⁻ diffusion region 2 in a roughly square shaped planar layout. Then diffusion region 2, p⁻ isolation region 4, and p⁻⁻ substrate region 1 are arranged in a planar layout that surrounds the n-type diffusion region 3 in a roughly concentric shape.

Hereinafter, in the direction parallel to the front surface (surface on the side of the diffusion regions 2 to 4 and 6) of the semiconductor substrate 10, the n-type diffusion region 3 side is the inside (inside of the chip) and the side opposite to the n-type diffusion region 3 side is the outside (outside of the chip). The n-type diffusion region 6 is disposed in a roughly square shaped planar layout, for example, on the p⁻⁻ substrate region 1 farther outside than the p⁻ isolation region 4. The n-type diffusion region 6 may contact the p⁻ isolation region 4. The diffusion region is a region that has been formed by introducing impurities into the semiconductor substrate 10 via ion implantation or the like.

In FIG. 1, the p⁻ isolation region 4 may be disposed on the entire front surface layer of the front surface of the semiconductor substrate 10 except for where then diffusion region 2 is located (in other words, the p⁻⁻ substrate region 1 in FIG. 1 may be made the p⁻ isolation region 4). In such a case, the n-type diffusion region 6 would be placed more on the outside than a p⁺ common potential region (fourth semiconductor region; described later) 5 of the p⁻ isolation region 4. The p⁻⁻ substrate region 1 would be only the surface layer of the rear surface of the semiconductor substrate 10 (the p-type region 1a on the substrate rear surface side, described later; see FIGS. 2A to 2F).

The p⁻⁻ substrate region 1 can be exposed to the front surface of the semiconductor substrate 10 instead of the p⁻ isolation region 4, as described later (see FIG. 2C), but providing the p⁻ isolation region 4 increases resistance against positive charges. This is due to an increase in the p-type impurity concentration on the front surface side of the semiconductor substrate 10 at the section where the p⁻ isolation region 4 is provided; thus, structure is less susceptible to adverse effects from positive charges accumulating on the interlaying insulating film, and the front surface side of the semiconductor substrate 10 is less susceptible to inverting to n-type.

The high potential side region 11 is surrounded by the HVJT 13 and would still be electrically isolated from the low potential side region 12 by the HVJT 13 even if the potential (hereinafter, high potential side power supply potential; maximum potential of the HVIC 20) Vcc1 of the positive electrode line of the high potential side auxiliary DC power supply E1 or the reference potential VS of the high potential side circuit unit 110 were to become a high potential of several hundred V (see FIG. 5). The reference potential VS of the high potential side circuit unit 110 is the potential of the node 123 shared by the upper arm IGBT 121 and lower arm IGBT 122. The high potential side region 11 is constituted by the n-type diffusion region 3.

The n-type diffusion region 3 is electrically connected to the high potential side power supply potential Vcc1. The n-type diffusion region 3 has disposed therein a high potential side circuit unit 110, for example. The high potential side circuit unit 110 is a complementary MOS (CMOS) that has the high potential side power supply potential Vcc1 as a power supply potential, operates at the reference potential VS, and generates a signal to be output from an AC output terminal OUT of the bridge circuit 120 on the basis of a signal from the low potential side circuit unit 115.

The HVJT 13 is a withstand voltage region constituted by a parasitic diode that is formed by the pn junction of the p⁻ isolation region 4 and then diffusion region 2. HVNMOSes 21 and 22 that form the set and reset level shift circuits of the high potential side circuit unit of the HVIC 20 are arranged in then diffusion region 2. The HVNMOSes 21 and 22 are level shift devices that convert signals referenced to the common potential COM to signals referenced to the power supply potential Vdc of the bridge circuit 120. The common potential COM is the potential of the main DC power supply of the bridge circuit 120 and the negative electrode side of the auxiliary DC power supply E1, E2 of the HVIC 20, and may be ground potential, for example. It is preferable that the HVNMOSes 21 and 22 be arranged with point symmetry about the high potential side region 11, for example.

P⁺ contact regions (hereinafter, p⁺ common potential region) 5 are selectively disposed inside the p⁻ isolation region 4 and separated from the n⁻ diffusion region 2. The p⁺ common potential regions 5 fix the p⁻ isolation region 4 to the common potential COM. The p⁺ common potential regions 5 are disposed locations that do not face the HVNMOSes 21 and 22 in the direction going from inside to outside (the radial direction D of the p⁻ isolation region 4).

Furthermore, the p⁺ common potential regions 5 are provided separated from a p-type back gate region 31 (described later) and source contact region 36 of the HVNMOSes 21 and 22 at a distance X1 at which a prescribed diffusion resistance (resistor) R' is obtained between the p-type back gate region 31 and source contact region 36.

The HVNMOSes 21 and 22 are arranged in positions respectively facing one of a pair of sides 4a, 4b of the roughly rectangular shaped p⁻ isolation region 4, for example. In such a case, the p⁺ common potential regions 5 would be disposed along the circumferential direction R of the p⁻ isolation region 4 on another pair of sides 4c, 4d of the p⁻ isolation region 4. The p⁺ common potential regions 5 may be disposed in a roughly U-shaped or roughly C-shaped planar layout that extends from the one pair of sides 4c and 4d to the other pair of sides 4a and 4b of the p⁻ isolation region 4.

The low potential side region 12 is constituted by the n-type diffusion region 6. The n-type diffusion region 6 is electrically connected to the highest potential of the low potential side circuit unit 115 (the potential Vcc2 of the positive electrode line of the auxiliary DC power supply E2 on the low voltage side; see FIG. 5). The inner circuit (low potential side circuit unit 115) and the like, which are not shown in the drawings, are arranged in the low potential side region 12. The low potential side circuit unit 115 is a CMOS circuit that operates at a potential referenced to the common potential COM, for example, and drives the HVNMOSes 21, 22.

Next, the configuration of the HVNMOSes 21 and 22 forming the set and reset level shift circuits will be described with reference to FIG. 2A. FIG. 2A shows a portion (the portion where the HVNMOS 21 is disposed; see the rectangular box A in FIG. 1) of one side 4a among four sides 4a to 4d of the p⁻ isolation region 4, which has a roughly rectangular shaped planar layout.

A voltage of approximately 10V, for example, is applied across the source and drain of the HVNMOS 21 when the HVNMOS 21 is ON. A maximum voltage of approximately 600V, for example, is applied across the source and drain of the HVNMOS 22 when the HVNMOS 22 is ON. The configuration of the HVNMOS 21 will be described below, but the configuration of the HVNMOS 22 is the same as the HVNMOS 21.

The HVNMOS 21 is a lateral n-channel MOSFET with a high withstand voltage (e.g., 600V or greater) and has a p-type diffusion region serving as the back gate (p-type back gate region; sixth semiconductor region) 31, an n⁺ source region (second semiconductor region) 32, a p⁺ contact region 33, an n⁺ drain region (third semiconductor region) 34, and a gate electrode 35. The p-type back gate region 31 and n⁺ drain region 34 are respectively selectively provided in the surface layer of the n⁻ diffusion region 2 on the substrate front surface side.

The p-type back gate region 31 may be provided in an annular planar layout that surrounds the n-type diffusion region 3 (i.e., the high potential side region 11; see FIG. 1). When the p-type back gate region 31 is provided in an annular planar layout that surrounds the n-type diffusion region 3, a parasitic diode is formed at the pn junction of the p-type back gate region 31, p⁻ isolation region 4, and n⁻ diffusion region 2, and the parasitic diode forms the HJVT 13.

Furthermore, the p-type back gate region 31 may reach the p-type region 1a on the substrate rear surface side. The p-type region 1a on the substrate rear surface side is a portion that has been left as the p⁻⁻ substrate region 1 due to the diffusion regions 2, 4, and 6 not being formed deeper from the semiconductor substrate 10 front surface in the depth direction Z (i.e., the p-type region 1a is the rear surface layer of the semiconductor substrate 10). The depth direction Z is a direction going from the front surface of the semiconductor substrate 10 toward the rear surface.

The specific resistance of the p-type region 1a on the substrate rear surface side is set high enough to be able to deeply spread the depletion layer extending from the pn junction of the p-type region 1a on the substrate rear surface side and n⁻ diffusion region 2 when the HVNMOS 21 is ON. In other words, the volume of the depletion layer extending toward the p-type region 1a of the substrate rear surface side is increased in order to ensure the withstand voltage of the HVNMOS 21. The withstand voltage is the maximum voltage at which malfunction or breakdown of the device does not occur. The specific resistance of the p-type region 1a of the substrate rear surface side may be approximately 100 Ω cm, for example.

The n⁺ drain region 34 is disposed more inside than the p-type back gate region 31 and is separated from the p-type back gate region 31. The n⁺ source region 32 and p⁺ contact region 33 are respectively selectively provided inside the p-type back gate region 31 and connect to each other. The n⁺ source region 32 and p-type back gate region 31 are shorted via the p⁺ contact region 33.

The shorting of the n⁺ source region 32 and p-type back gate region 31 suppresses operation of an npn parasitic bipolar transistor (hereinafter, lateral direction npn parasitic bipolar transistor) constituted by the n⁺ source region 32, p-type back gate region 31, and n⁻ diffusion region 2, which are formed along the substrate front surface in the direction parallel to the substrate front surface. Due to this, it is possible to prevent device breakdown caused by the lateral direction npn parasitic bipolar transistor.

The n⁺ source region 32 and p⁺ contact region 33 may be repeatedly placed in an alternating manner in the circumferential direction R of the p⁻ isolation region 4, for example. Hereinafter, one or more groups of the n⁺ source region 32 and p⁺ contact region 33 repeatedly placed in an alternating manner in the circumferential direction R of the p⁻ isolation region 4 will be collectively referred to as the source contact region 36. The ends 36a, 36b of the source contact region 36 may be either the n⁺ source region 32 or the p⁺ contact region 33.

The source contact region 36 is electrically connected to the electrode pad (COM electrode pad) 41 of the common potential COM via the resistor (source follower resistor) $R_{SF}$. In other words, the HVNMOS 21 has a source follower configuration. The source follower resistor $R_{SF}$ corresponds to the current feedback resistor 111 shown in FIG. 5. The source follower resistor $R_{SF}$ functions to drop the voltage when the HVNMOS 21 is ON in order to reduce the drain current of the HVNMOS 21.

The source follower resistor $R_{SF}$ is a resistive element such as a polysilicon (poly-Si) layer provided over the front surface of the semiconductor substrate 10 with an insulating layer (not shown) therebetween, for example. When the source follower resistor $R_{SF}$ is made of a polysilicon layer, one end of the polysilicon layer is connected to the source contact region 36 via a contact hole in an insulating layer for insulating the source follow resistor $R_{SF}$ from the semiconductor substrate 10, for example, and the other end is connected to the COM electrode pad 41. The resistance of the source follower resistor $R_{SF}$ may be approximately 1 kΩ, for example.

The portion of then diffusion region 2 sandwiched by the p-type back gate region 31 and n⁺ drain region 34 functions as an n⁻ drift region of the HVNMOS 21. The portion of the p-type back gate region 31 sandwiched by the n⁻ drift region and n⁺ source region 32 has a gate electrode 35 disposed on the surface thereof with a gate insulating film (not shown) interposed therebetween. The n⁺ drain region 34 is electrically connected to a drain electrode (not shown).

The p⁻ isolation region 4 is disposed further outside than the p-type back gate region 31 of the HVNMOS 21. The p⁻ isolation region 4 contacts the p-type back gate region 31, n⁺ source region 32, and p⁺ contact region 33 of the HVNMOS 21 and is electrically connected to these regions. The p⁻ isolation region 4 also contacts the p⁻⁻ substrate region 1 and is electrically connected to the p⁻⁻ substrate region 1. The p⁺ common potential regions 5 are selectively provided inside the p⁻ isolation region 4.

The p⁺ common potential regions 5 function as the anode contact region of the parasitic diode formed in the HVJT 13. The p⁺ common potential regions 5 are not disposed in locations facing the n⁺ source region 32 and p⁺ contact region 33 of the HVNMOS 21 in the radial direction D of the p⁻ isolation region 4. The p⁺ common potential regions 5 are electrically connected to the COM electrode pad 41 and fix the p⁻ isolation region 4 and p⁻⁻ substrate region 1 to the common potential COM.

The p⁺ common potential regions 5 are provided separated from the p-type back gate region 31 and source contact region 36 at a prescribed distance X1 at which a prescribed diffusion resistance (resistor) R' is obtained at a portion of the HVNMOS 21 sandwiched between the p-type back gate region 31 and source contact region 36. In other words, the p⁺ common potential regions 5 and the p-type back gate region 31 and source contact region 36 of the HVNMOS 21 are electrically connected via the diffusion resistors R' (or the substrate resistors as described later; see FIGS. 2C and 2D) between the p+ common potential region 5 and the p-type back gate region 31 and source contact region 36 of the HVNMOS 21.

The p⁺ common potential regions 5 and the p-type back gate region 31 and source contact region 36 of the HVNMOS 21 are connected by the diffusion resistors R' (or substrate resistors), thus causing a difference in potential between the p-type back gate region 31 and p⁻⁻ substrate region 1 (the p-type region 1a on the substrate rear surface side). This makes it possible to electrically isolate the source potential of the HVNMOS 21 from the common potential COM. The difference in potential between the p-type back gate region 31 and p⁻⁻ substrate region 1 is adjusted by the total resistance of the respective diffusion resistors R' formed on both ends 36a, 36b of the source contact region 36.

Furthermore, the p-type back gate region 31 is shorted to the p⁻⁻ substrate region 1 via the p⁻ isolation region 4 (or, as described later, directly shorted to the p⁻⁻ substrate region 1; see FIGS. 2C, 2D); therefore, a parasitic structure is not formed inside the semiconductor substrate 10. Thus, it is possible to prevent the impedance between the n⁺ source region 32 of the HVNMOS 21 and the common potential COM from becoming very low. Accordingly, this provides stable current control effects (drain current stabilization) of the source follower configuration HVNMOS 21.

The diffusion resistors R' and source follower resistor $R_{SF}$ are connected in parallel between the COM electrode pad 41 and the source contact region 36 of the HVNMOS 21. In such a case, it is possible to stabilize the drain current of the HVNMOSes 21, 22 (by using the source follower resistor $R_{SF}$) and to prevent parasitic operation (by using the diffusion resistors R') by using different resistors, respectively. Therefore, it is possible to minimize variation in the resistance of the source follower resistor $R_{SF}$ and fluctuations in the resistance of the source follower resistor $R_{SF}$ caused by noise (displacement current).

Furthermore, when the diffusion resistors R' and source follower resistor $R_{SF}$ are connected in parallel, the diffusion resistors R' increase resistance more than the source follower resistor $R_{SF}$ to a high resistance of several dozen kΩ (e.g., 1 kΩ to 10 kΩ). Specifically, the shortest distance X1 between the p⁺ common potential region 5 and the ends 36a, 36b of the source contact region 36 in the circumferential direction R of the p⁻ isolation region 4 is approximately 5 µm to 100 µm inclusive, for example. The impurity concentration of the p⁻ isolation region 4 should be set to approximately $1\times10^{13}/cm^3$, for example.

Furthermore, when the p-type back gate region 31 is disposed in an annular planar layout that surrounds the n-type diffusion region 3, the diffusion resistors R' form the total resistance of the p⁻ isolation region 4 and p-type back gate region 31. Moreover, the diffusion resistors R' may be used as the source follower resistor itself without providing the source follower resistor $R_{SF}$. In this case, it is preferable that the diffusion resistors R' be set to a resistance that causes a drop in voltage less than or equal to a value (approximately 3-4V) equivalent to the gate threshold voltage of the HVNMOS 21 subtracted from the voltage applied across the gate/source (approximately 5V, for example).

Next, modification examples of the HVNMOS 21 will be described. FIGS. 2B to 2F are perspective views showing structures of modification examples of a semiconductor device of Embodiment 1. FIGS. 2B to 2F each show a cross-sectional structure of the rectangular box A in FIG. 1. The HVNMOS 21 shown in FIGS. 2B to 2F differs from the HVNMOS 21 shown in FIG. 2A in the ways described below.

Figure 2B:
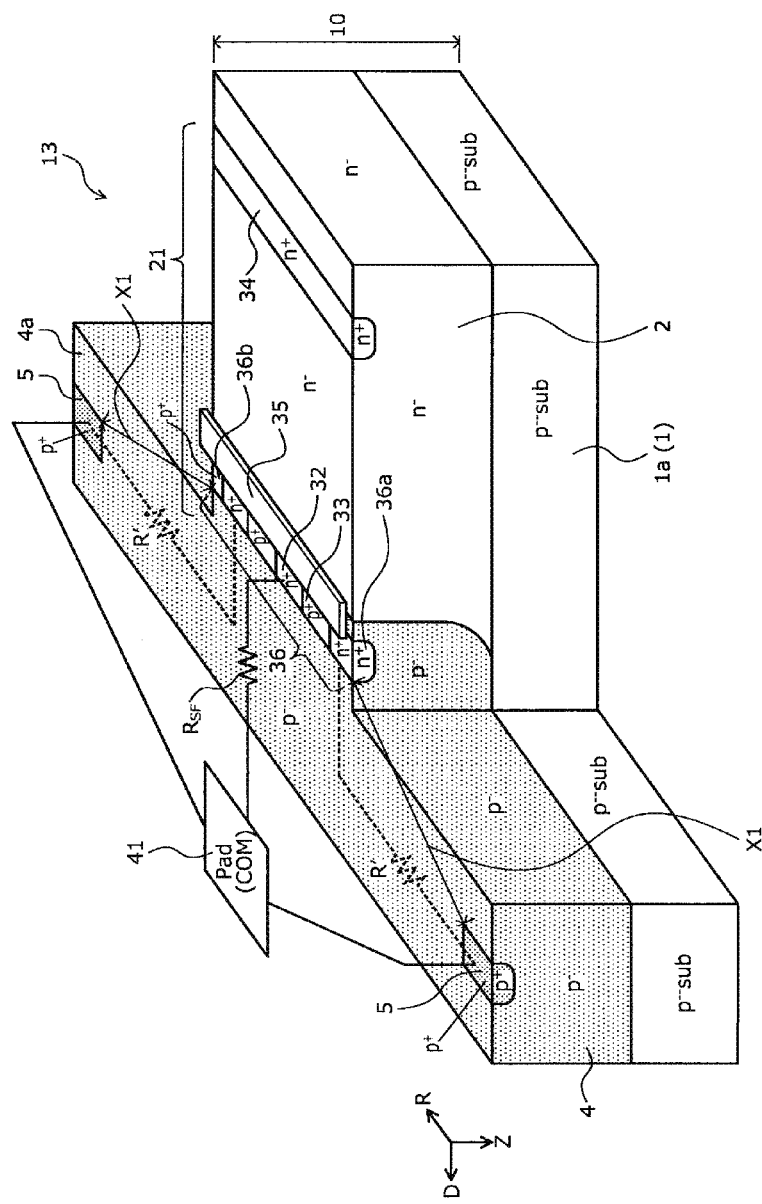
FIG. 2B is a perspective view showing a structure of a modification example of a semiconductor device of Embodiment 1.

As shown in FIG. 2B, the p⁻ isolation region 4 may be used as the p-type back gate region of the HVNMOS 21. In this case, the n⁺ source region 32 and p⁺ contact region 33 of the HVNMOS 21 would be arranged on the p⁻ isolation region 4. The width of the p⁻ isolation region 4 may be made wider than FIG. 2A to the extent that a portion of the HVNMOS 21 is disposed in the p⁻ isolation region 4. The gate electrode 35 is provided over the surface of a portion of the p⁻ isolation region 4 sandwiched between the n⁻ drift region and n⁺ source region 32, with a gate insulating film (not shown) interposed therebetween.

Figure 2C:
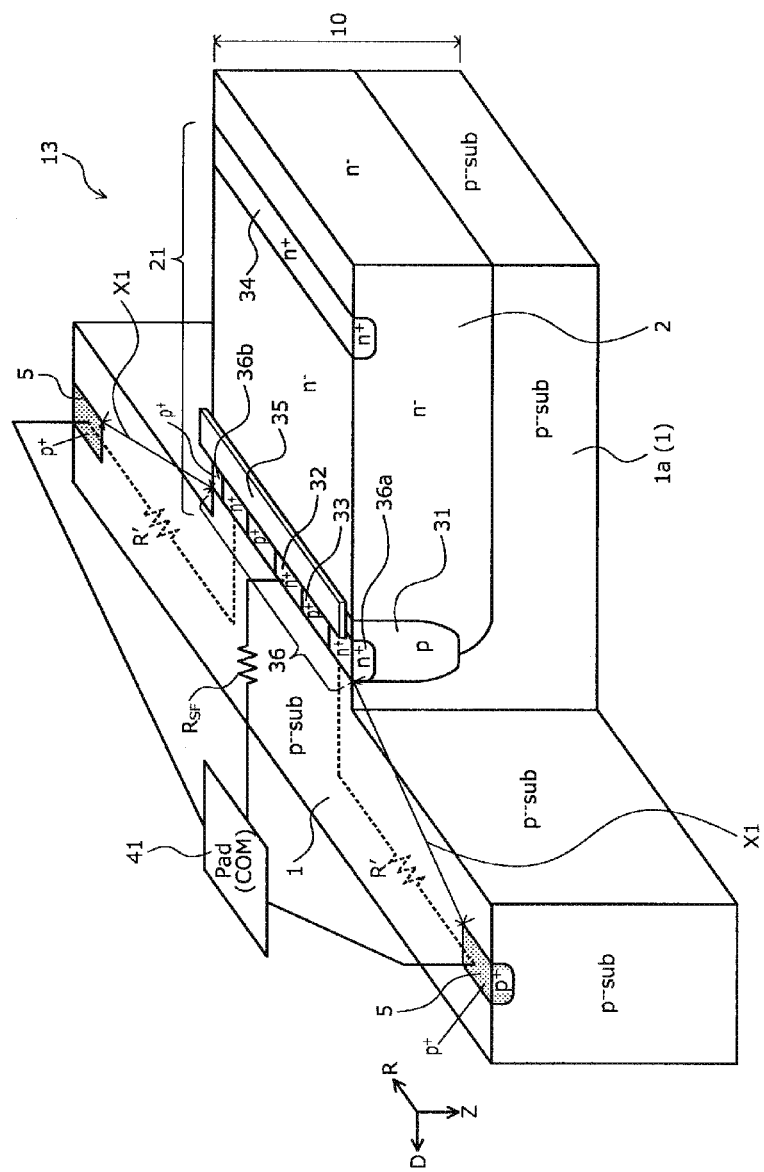
FIG. 2C is a perspective view showing a structure of a modification example of the semiconductor device of Embodiment 1.

As shown in FIG. 2C, the p⁻ isolation region may be formed by the p⁻⁻ substrate region 1, which has been left in a slit shape between then diffusion region 2 and n-type diffusion region 6 (see FIG. 1) so as to be exposed to the substrate front surface from the p-type region 1a on the substrate rear surface side. In such a case, the HVJT 13 would be constituted by the parasitic diode formed at the pn junction of the p⁻⁻ substrate region 1 and n⁻ diffusion region 2. The p-type back gate region 31 of the HVNMOS 21 is provided so as to straddle the boundary between the p⁻⁻ substrate region 1 and n⁻ diffusion region 2. The p⁺ common potential region 5 is disposed with the same configuration as shown in FIG. 2A in the p⁻⁻ substrate region 1 that has been left as a slit so as to be exposed to the substrate front surface.

Figure 2D:
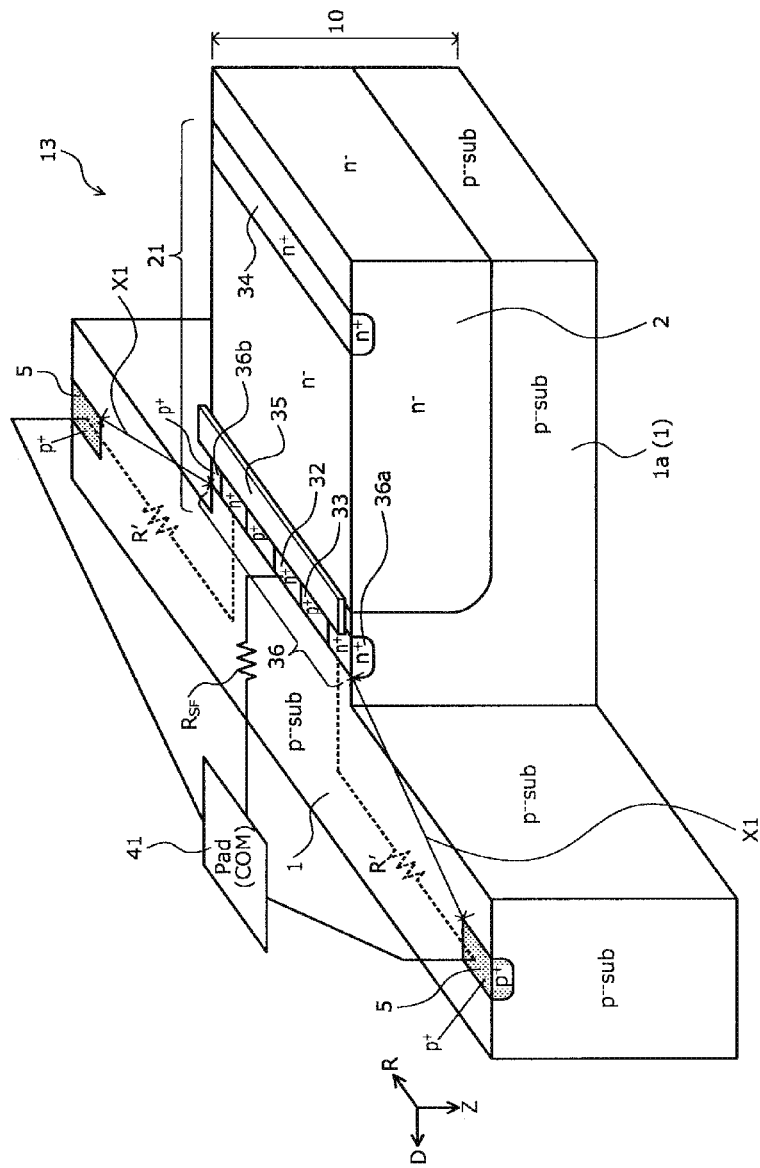
FIG. 2D is a perspective view showing a structure of a modification example of the semiconductor device of Embodiment 1.

The HVNMOS 21 shown in FIG. 2B may be used for the HVNMOS 21 shown in FIG. 2C (see FIG. 2D). In other words, the p⁻ isolation region (see FIG. 2C) constituted by the p⁻ substrate region 1 that has been left as a slit so as to be exposed to the substrate front surface may be used as the p-type back gate region of the HVNMOS 21. In this case, the n⁺ source region 32 and p⁺ contact region 33 of the HVNMOS 21 would be arranged on the p⁻ substrate region 1 that has been left as a slit so as to be exposed to the substrate front surface. The gate electrode 35 is provided over the surface of a portion of the p⁻⁻ substrate region 1 sandwiched between the n⁻ drift region and n⁺ source region 32, with a gate insulating film (not shown) interposed therebetween.

When the p⁻ isolation region is formed by the p⁻⁻ substrate region 1 as shown in FIGS. 2C and 2D, parasitic operation is prevented due to the substrate resistors of the p⁻⁻ substrate region 1 between the p⁺ common potential region 5 and the source contact region 36 of the HVNMOS 21.

Figure 2E:
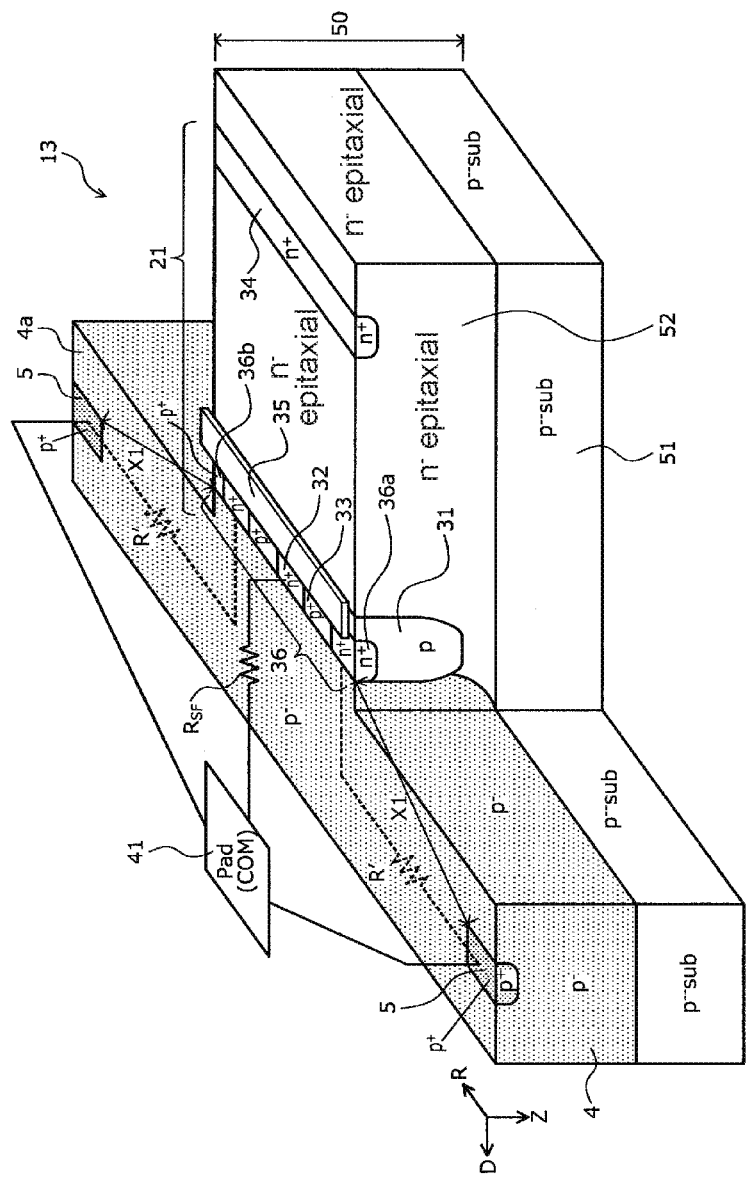
FIG. 2E is a perspective view showing a structure of a modification example of the semiconductor device of Embodiment 1.

Furthermore, as shown in FIG. 2E, the n⁻ epitaxial layer 52 may be provided instead of then diffusion region 2. In this case, an epitaxial substrate 50 on which an n⁻ epitaxial layer 52 has been epitaxially grown on a p⁻⁻ support substrate 51 would be used, for example. In FIG. 2E, the p⁻⁻ support substrate 51 is shown as "p⁻⁻ sub" and then epitaxial layer 52 is shown as "n⁻ epitaxial." The p⁻ isolation region 4 is disposed in a roughly annular planar layout on the epitaxial substrate 50 and penetrates the n⁻ epitaxial layer 52 in the depth direction Z to reach the p⁻⁻ support substrate 51. An n-type diffusion region (not shown; reference character 3 in FIG. 1) that forms a high potential side region 11 of then epitaxial layer 52 is disposed more on the inside than the p⁻ isolation region 4. A low potential side region 12 is formed at a portion of the n epitaxial layer 52 more outside than the p⁻ isolation region 4. The respective parts of the HVNMOS 21 are arranged in the same configuration as FIG. 2A on then epitaxial layer 52.

Figure 2F:
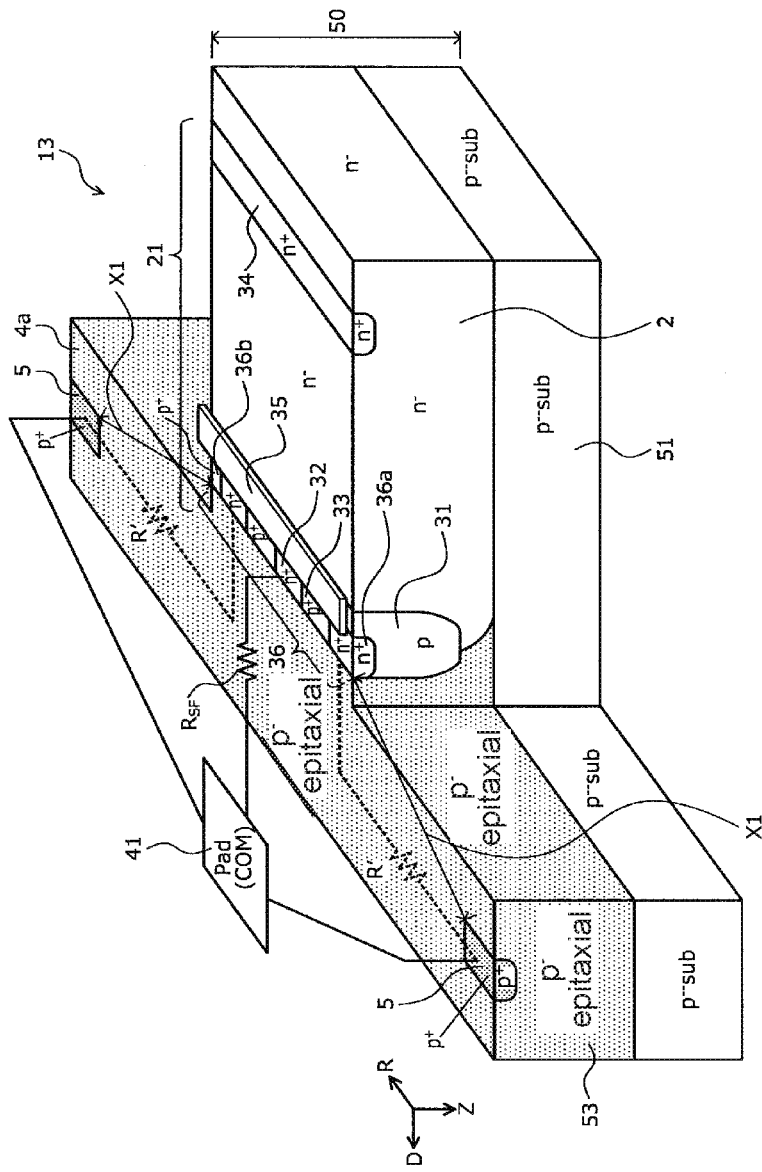
FIG. 2F is a perspective view showing a structure of a modification example of the semiconductor device of Embodiment 1.

Furthermore, as shown in FIG. 2F, the p⁻ epitaxial layer 53 may be provided instead of the p⁻ isolation region 4. In FIG. 2F, the p⁻ epitaxial layer 53 is shown as "p⁻ epitaxial." In this case, an epitaxial substrate 50 on which a p⁻ epitaxial layer 53 has been epitaxially grown on a p⁻⁻ support substrate 51 would be used, for example. Then isolation region 2 is disposed in a roughly rectangular shaped planar layout on the epitaxial substrate 50 and penetrates the p⁻ epitaxial layer 53 in the depth direction Z to reach the p⁻⁻ support substrate 51. The n-type diffusion region (not shown; see reference character 3 in FIG. 1) forming the high potential side region 11 and the respective parts of the HVNMOS 21 with the same configuration as in FIG. 2A are arranged in the n⁻ diffusion region 2. The p⁺ common potential region 5 is disposed with the same configuration as FIG. 2A inside the p⁻ epitaxial layer 53. Of the p⁻ epitaxial layer 53, the n-type diffusion region (not shown; reference character 6 in FIG. 1) forming the low potential side region 12 is disposed more outside than the p⁺ common potential regions 5.

Figure 6:
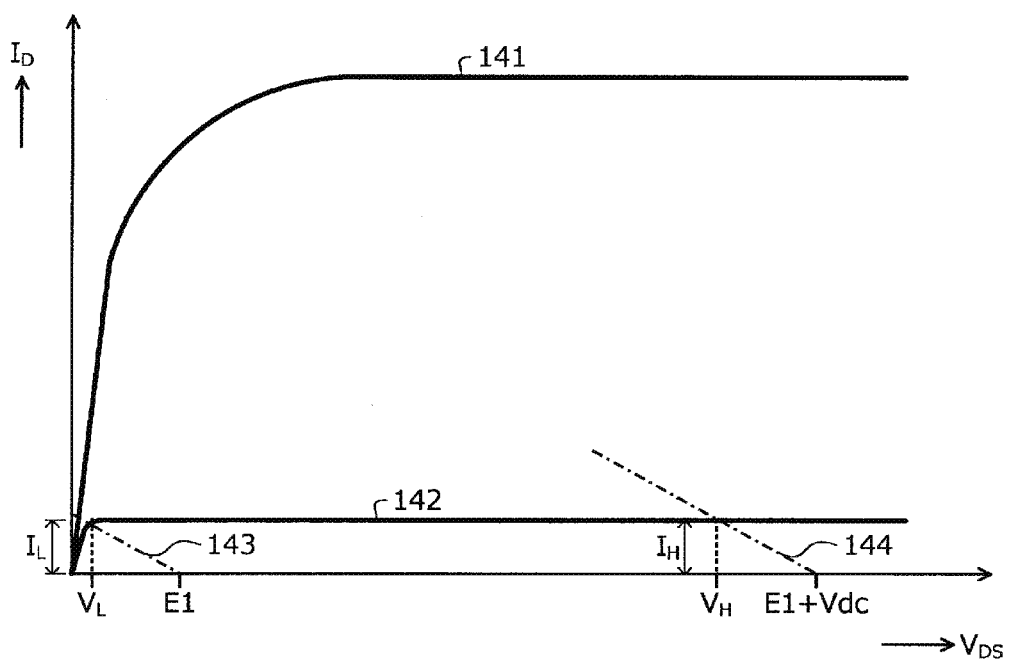
FIG. 6 is a characteristics diagram showing voltage/current characteristics of the level shift device in FIG. 5.
Figure 7:
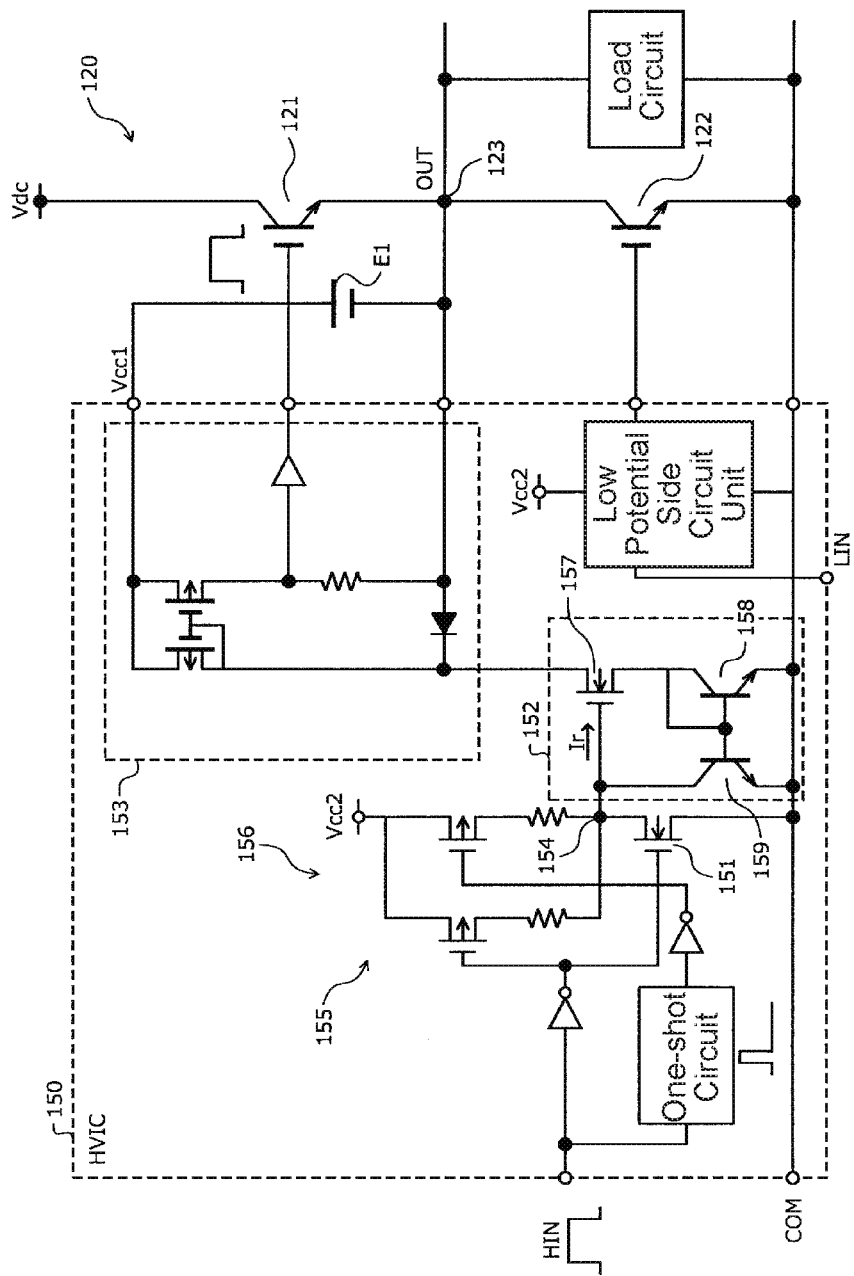
FIG. 7 is a circuit diagram showing another example of a circuit configuration of an HVIC in which a conventional level shift device is embedded.
Figure 8:
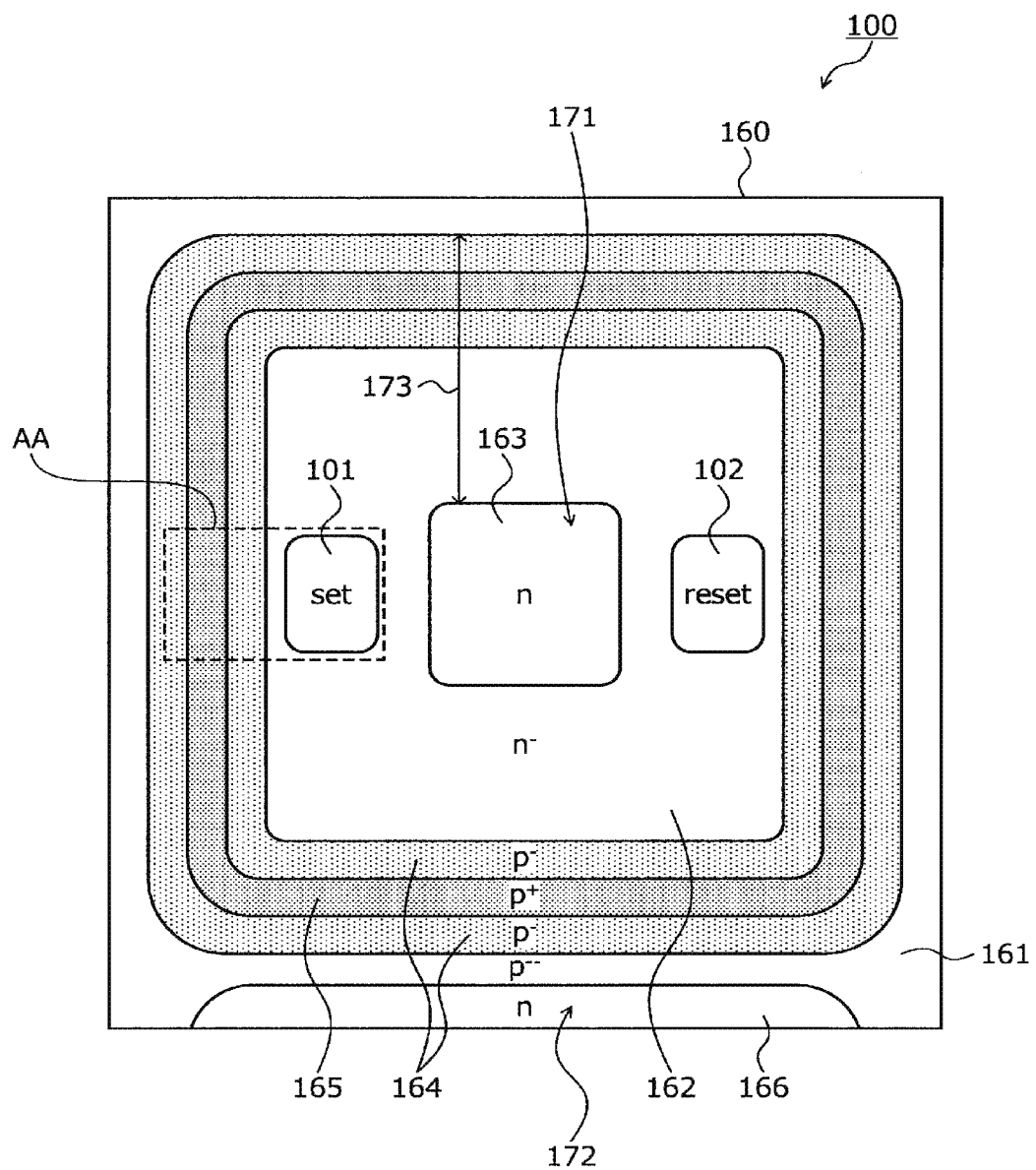
FIG. 8 is a plan view showing a planar layout of a conventional semiconductor device.
Figure 9:
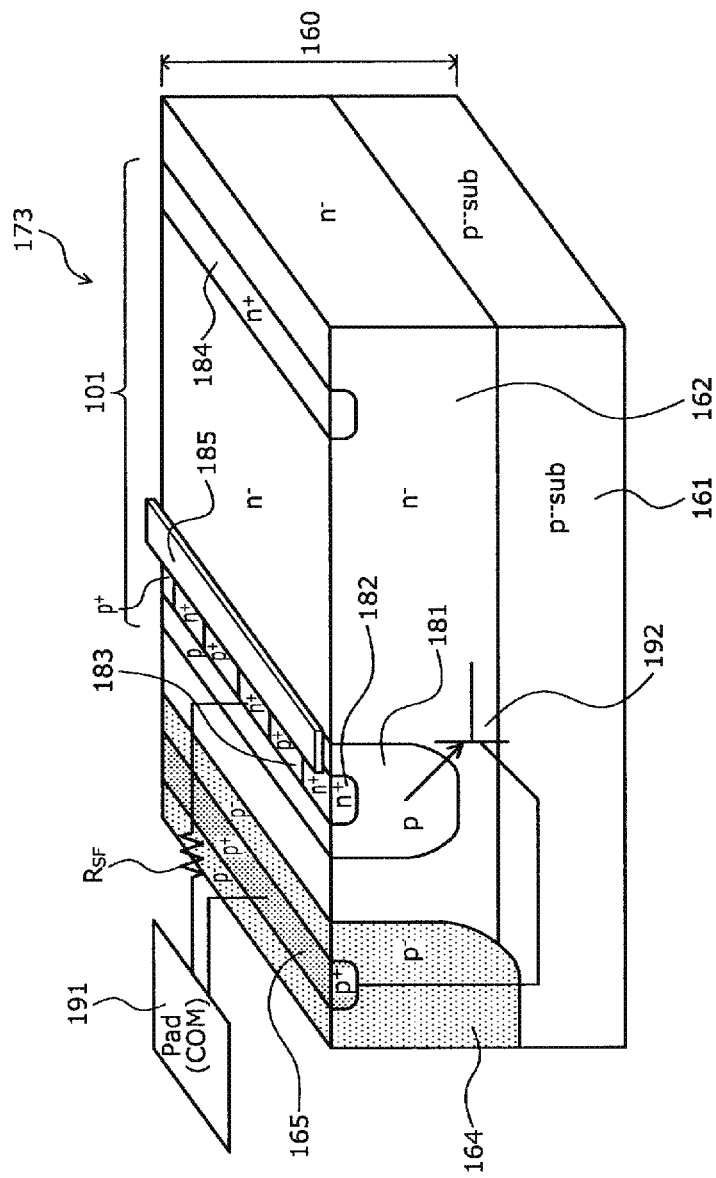
FIG. 9 is a perspective view of a cross-sectional structure of the rectangular box AA in FIG. 8.

As described above, Embodiment 1 makes it possible to improve the constant current characteristics of drain current (i.e., to obtain the voltage/current characteristics shown in FIG. 6) for the two HVNMOSes and to prevent a reduction in transmission delay time differences by configuring the respective HVNMOSes (level shift devices) that constitute the set and reset level shift circuits to have a source follower configuration. Moreover, by configuring the HVNMOSes (level shift devices) to have the source follower configuration, it is possible to suppress the drain current, and thus possible to suppress heat generation caused by high speed switching (i.e., to reduce heat loss), which allows the devices to operate at higher frequencies.

Furthermore, in Embodiment 1, the p⁺ common potential regions are disposed so as to be separated from the source contact region and p-type back gate region of the HVNMOS by a prescribed distance. Therefore, the p⁺ common potential regions and p-type back gate region & source contact region of the HVNMOS are electrically connected by diffusion resistors (substrate resistors) between the p⁺ common potential regions and the p-type back gate region & source contact region of the HVNMOS. This makes it possible to electrically isolate the source potential of the HVNMOS from the common potential, and makes it possible to operate the HVNMOS.

In Embodiment 1, the p-type back gate region of the HVNMOS is shorted to the p⁻⁻ substrate region; thus, a parasitic structure will not be formed inside the semiconductor substrate, even if the semiconductor substrate has elements that are isolated by a self-isolating structure pn junction isolating structure, or the like. This makes it possible to stably obtain a current control effect (drain current stabilization) of the source follower configuration HVNMOS. Accordingly, in a level shift circuit provided with the HVNMOS, it is possible to perform stable level shift operations.

Furthermore, in Embodiment 1, because a parasitic structure is not formed in the semiconductor substrate even if the semiconductor substrate has elements isolated by a self-isolating structure or pn junction isolating structure, it is possible to use a low-cost semiconductor substrate manufactured by the floating zone (FZ) method, the Czochralski (CZ) method, an epitaxial growth method, etc. This makes it unnecessary to use an expensive semiconductor substrate such as a SOI (silicon on insulator) substrate in which a thick insulating layer is embedded inside a silicon substrate, thus making it possible to lower costs.

Embodiment 2

Figure 3:
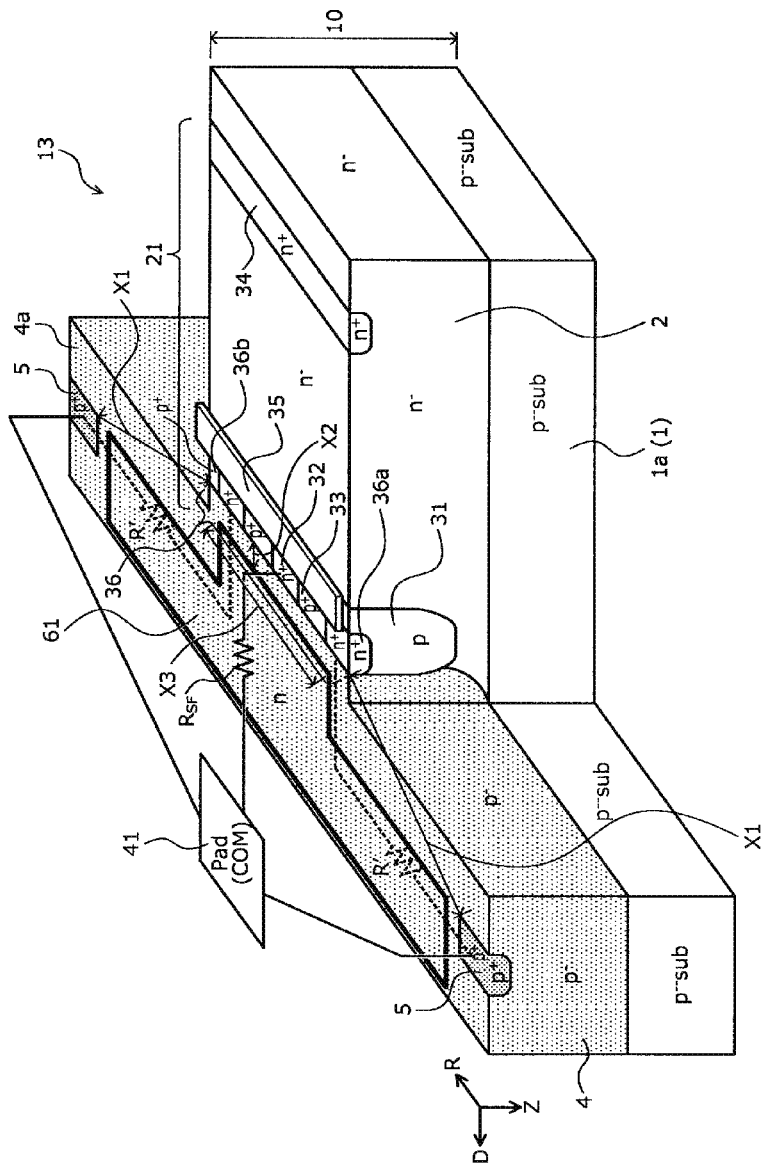
FIG. 3 is a perspective view showing a structure of a semiconductor device of Embodiment 2.

A method of manufacturing a semiconductor device according to Embodiment 2 will be explained. FIG. 3 is a perspective view showing a structure of a semiconductor device of Embodiment 2. The semiconductor device of Embodiment 2 differs from the semiconductor device of Embodiment 1 in that an n-type diffusion region (seventh semiconductor region) 61 is disposed in the p⁻ isolation region 4 and in that the diffusion resistors R' between the p⁺ common potential regions 5 and source contact region 36 of the HVNMOS 21 have higher resistances. Although not shown in the drawings, in Embodiment 2, the configuration of the HVNMOS 22 is the same as the HVNMOS 21.

The n-type diffusion region 61 is selectively provided in the surface layer of the p⁻ isolation region 4 on the substrate front surface layer between the p⁺ common potential regions 5 and source contact region 36 of the HVNMOS 21. The resistances of the diffusion resistors R' between the p⁺ common potential regions 5 and the source contact region 36 of the HVNMOS 21 are determined by the sheet resistance of a portion of the p⁻ isolation region 4 near an interface with the n-type diffusion region 61. Providing the n-type diffusion region 61 in the p⁻ isolation region 4 increases the resistance of the diffusion resistors R' between the p⁺ common potential regions 5 and the source contact region 36 of the HVNMOS 21. The reason for this is as follows.

The p⁻ isolation region 4 is formed by diffusing p-type impurities that have been introduced by ion implantation or the like, for example. Thus, the impurity concentration distribution in the p⁻ isolation region 4 will have a Gaussian distribution whereby areas closer to the front surface of the semiconductor substrate 10 have higher concentrations, with the concentration progressively diminishing in the depth direction Z. Accordingly, by introducing and diffusing n-type impurities via ion implantation or the like into the substrate front surface layer in order to form the n-type diffusion region 61, the effective p-type impurity concentration of the substrate front surface side of the p⁻ isolation region 4 will be reduced, which thus increases the sheet resistance of the substrate front surface side of the p⁻ isolation region 4.

The sheet resistance of the substrate front surface side of the p⁻ isolation region 4 can be increased even if n-type impurities are introduced into the substrate front surface layer of the p⁻ isolation region 4 to the extent that the conductivity type of the p⁻ isolation region 4 does not invert. In other words, instead of the n-type diffusion region 61, it is possible to provide a p⁻⁻ diffusion region that is formed by introducing n-type impurities into the p⁻ isolation region 4, the p⁻⁻ diffusion region having a lower impurity concentration than the p⁻ isolation region 4. In such a case, the impurity concentration of the p⁻ isolation region 4 would be approximately $1 \times 10^{13}/cm^3$, for example, and the impurity concentration of the p⁻⁻ diffusion region would be approximately $6 \times 10^{12}/cm^3$, for example.

Furthermore, as described later, even if the p⁻ isolation region 4 were to be made of a p⁻ epitaxial layer (see FIG. 2E), providing the n-type diffusion region 61 in the p⁻ isolation region 4 would increase the resistance of the diffusion resistors R' between the p⁺ common potential regions 5 and the source contact region 36 of the HVNMOS 21. This is because providing the n-type diffusion region 61 in the p⁻ isolation region 4 reduces the volume of the p⁻ isolation region 4, and the p-type impurity concentration per unit volume of the p⁻ isolation region 4 and n-type diffusion region 61 increases.

By providing the n-type diffusion region 61 (or p⁻⁻ diffusion region) in the p⁻ isolation region 4 in this manner, diffusion resistors R' of the prescribed resistance can be obtained even if the shortest distance X1 between the p⁺ common potential regions 5 and source contact region 36 of the HVNMOS 21 is reduced. Moreover, reducing the shortest distance X1 between the p⁺ common potential regions 5 and source contact region 36 of the HVNMOS 21 lowers the amount of inactive area between the p⁺ common potential region 5 and the source contact region 36 of the HVNMOS 21, thus making it possible to reduce the size of the chip. An inactive area is an area where no wiring, circuits, etc. are arranged.

The n-type diffusion region 61 faces the source contact region 36 of the HVNMOS 21 in the radial direction D of the p⁻ isolation region 4 with a prescribed distance X2 between the n-type diffusion region and source contact region. The length (the length in the circumferential direction R of the p⁻ isolation region 4) X3 of the portion where the n-type diffusion region 61 faces the source contact region 36 at the distance X2 is preferably as long as possible. FIG. 3 shows a case in which the n-type diffusion region 61 (surrounded by the bold line) has been disposed in a roughly T shaped planar layout in which a portion of the n-type diffusion region 61 facing the source contact region 36 at distance X2 is protruding inside. Placing the n-type diffusion region 61 in the p⁻ isolation region 4 makes it possible to increase the resistance of the diffusion resistors R', and various modifications can be made to the planar layout of the n-type diffusion region 61.

The n-type diffusion region 61 may be fixed to any one of a floating potential, the back gate potential, and the high potential side power supply potential Vcc1. If fixing the n-type diffusion region 61 to a potential other than the back gate potential, the n-type diffusion region 61 would be separated from the p-type back gate region 31 and source contact region 36 of the HVNMOS 21 by distance X2 as described above (i.e., X2>0). The reason for this is that, when the n-type diffusion region 61 is fixed to the high potential side power supply potential Vcc1, for example, the withstand voltage of the entire circuit is rate limited by the withstand voltage in the lateral direction of the HVNMOS 21.

For example, consider a case in which a voltage corresponding to the difference in potential when the common potential COM is subtracted from the high potential side power supply potential Vcc1 is applied between the p⁻ isolation region 4 and n-type diffusion region 61 (i.e., a case in which the n-type diffusion region 61 is fixed to the high potential side power supply potential Vcc1). In such a case, the withstand voltage in the lateral direction of the HVNMOS 21 would be reduced due to operation of the npn parasitic bipolar transistor in the lateral direction, or due to a depletion layer spreading from the pn junction of the p⁻ isolation region 4 and n-type diffusion region 61, punching through to the source contact region 36 of the HVNMOS 21, causing the HVNMOS 21 to break down due to an approximately 20V voltage across the source/drain, and becoming leakage current between the high potential side power supply potential Vcc1 and common potential COM, or due to other factors. The distance X2 between the n-type diffusion region 61 and source contact region 36 of the HVNMOS 21 is set so that such problems do not occur. Specifically, the distance X2 between the n-type diffusion region 61 and the source contact region 36 of the HVNMOS 21 may be set to approximately 5 μm or greater, for example.

When fixing the n-type diffusion region 61 to the back gate potential, the n-type diffusion region 61 may contact the p-type back gate region 31 and source contact region 36 of the HVNMOS 21 (i.e., X2=0).

Embodiment 2 may be applied to the HVNMOS 21 shown in FIG. 2B (which would be a configuration without the p-type back gate region 31). Embodiment 2 may also be applied to the HVNMOS 21 shown in FIGS. 2C and 2D (which would be an element isolation structure in which the p⁻ isolation region is formed by the p⁻⁻ substrate region 1).

In other words, the n-type diffusion region 61 may be disposed in the p⁻⁻ substrate region 1 forming the p⁻ isolation region between the p⁺ common potential region 5 and the source contact region 36 of the HVNMOS 21. Furthermore, Embodiment 2 may be applied to the HVNMOS 21 shown in FIGS. 2E and 2F (which would be a configuration in which one of the n⁻ diffusion region 2 and p⁻ isolation region 4 is an epitaxial layer).

As described above, Embodiment 2 can obtain similar effects to Embodiment 1. Moreover, in Embodiment 2, providing the n-type diffusion region in the p⁻ isolation region makes it possible to obtain diffusion resistors of a prescribed resistance even if there is a reduction in the shortest distance between the p⁺ common potential regions, which fix the p⁻ isolation region to the common potential, and the source contact region of the HVNMOS. This increases the degree of freedom in arranging the p⁺ common potential regions and reduces control of the chip layout.

Embodiment 3

Figure 4A:
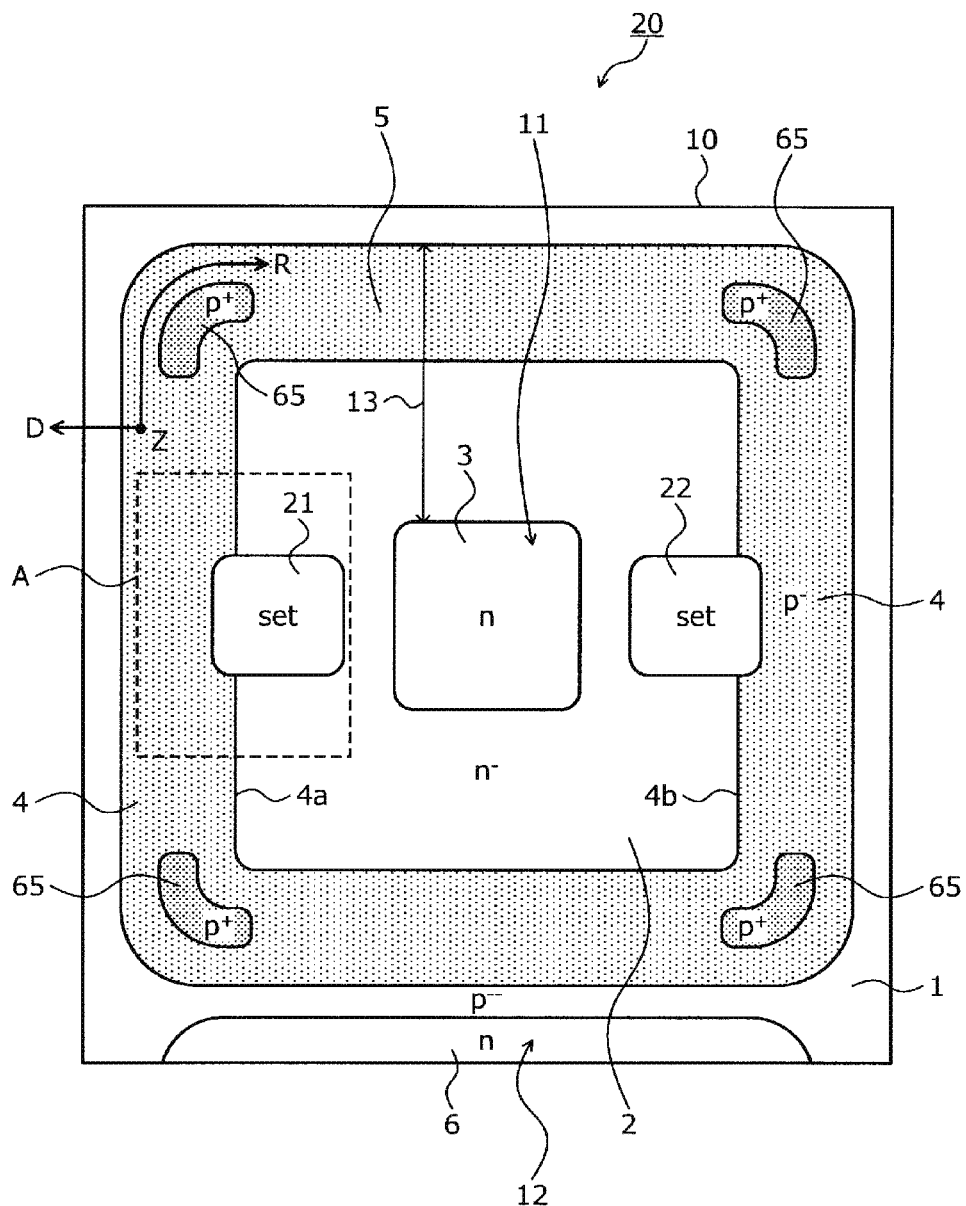
FIG. 4A is a plan view of the planar layout of a semiconductor device of Embodiment 3.

Next, the structure of a semiconductor device according to Embodiment 3 will be explained. FIG. 4A is a plan view of the planar layout of the semiconductor device of Embodiment 3. The semiconductor device of Embodiment 3 differs from the semiconductor device of Embodiment 1 in that p⁺ common potential regions 65, which fix the p⁻ isolation region 4 to the common potential COM, are arranged only near the vertices of the p⁻ isolation region 4 arranged in a roughly rectangular shaped planar layout.

As described above, Embodiment 3 can obtain similar effects to Embodiments 1 and 2, regardless of the arrangement of the p⁺ common potential regions.

Embodiment 4

Figure 4B:
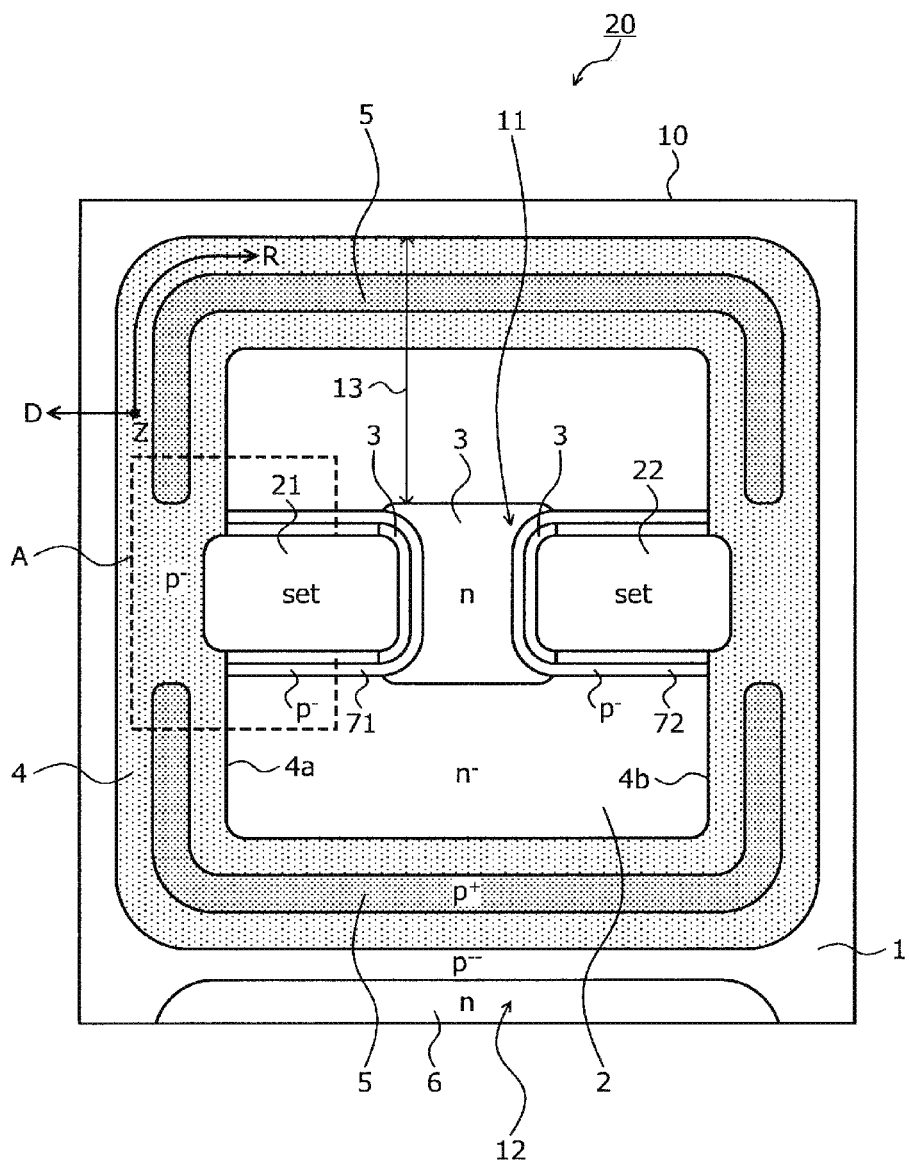
FIG. 4B is a plan view of the planar layout of a semiconductor device of Embodiment 4.

Next, the structure of a semiconductor device according to Embodiment 4 will be explained. FIG. 4B is a plan view of the planar layout of the semiconductor device of Embodiment 4. The semiconductor device of Embodiment 4 differs from the semiconductor device of Embodiment 1 in the following two aspects. The first difference is that the HVNMOSes 21 and 22 extend into the n-type diffusion region 3 from the n⁻ diffusion region 2. The second difference is that p⁻ slit regions 71 and 72 are provided so as to respectively surround the HVNMOSes 21, 22.

Specifically, the p⁻ slit regions 71, 72 are provided in a roughly U-shaped planar layout in an n-type region made of then diffusion region 2 and n-type diffusion region 3. The p⁻ slit regions 71, 72, are provided at a depth that reaches the p⁻⁻ substrate region 1 in the depth direction from the front surface of the semiconductor substrate 10. In other words, the p⁻ slit regions 71, 72 divide the n⁻ diffusion region 2 and n-type diffusion region 3 into a section where the HVNMOSes 21, 22 are provided, and a section where the HVNMOSes are not provided.

Furthermore, the p⁻ slit regions 71, 72 contact the p⁻ isolation region 4 with both roughly U-shaped ends thereof. In other words, the HVNMOS 21 is surrounded by a roughly rectangular shaped p⁻ region with the p⁻ slit regions 71 on three sides and the p⁻ isolation region 4 on the other remaining side. The HVNMOS 22 is surrounded by a roughly rectangular shaped p⁻ region with the p⁻ slit regions 72 on three sides and the p- isolation region 4 on the other remaining side. The n⁺ drain region 34 of the HVNMOSes 21, 22 is provided in the n-type diffusion region 3.

The p⁻ slit regions 71, 72 may expose the p⁻⁻ substrate region 1 (the portion of the p⁻⁻ semiconductor substrate 10 where the diffusion regions 2, 3 are not formed) to the front surface of the semiconductor substrate 10. The p⁻ slit regions 71, 72 may be p⁻ diffusion regions formed by introducing impurities into the p⁻⁻ substrate region 1 or diffusion regions 2, 3, etc. via ion implantation or the like.

Although not shown in the drawings, the p⁻ slit regions 71, 72 are provided only in the n⁻ diffusion region 2. In this case, the n+drain region 34 of the HVNMOSes 21, 22 is provided in then diffusion region 2, similar to Embodiment 1. The p⁻ slit regions 71, 72 divide the n⁻ isolation region 2 into a section where the HVNMOSes 21, 22 are provided and a section where the HVNMOSes are not provided.

The p⁻ slit regions 71, 72 become depleted when a high voltage is applied to the n⁺ drain region 34 of the HVNMOSes 21, 22 (for example, when, in the circuit of FIG. 5, the upper arm IGBT 121 turns ON and the potential of the AC output terminal OUT becomes approximately the power supply potential Vdc of the bridge circuit 120).

As described above, Embodiment 4 can obtain similar effects to Embodiments 1 to 3. In Embodiment 4, even if a high voltage were to be applied to the n⁺ drain region of the HVNMOS, the p⁻ slit regions surrounding the HVNMOS would deplete, thus ensuring the withstand voltage.

Embodiment 5

Figure 4C:
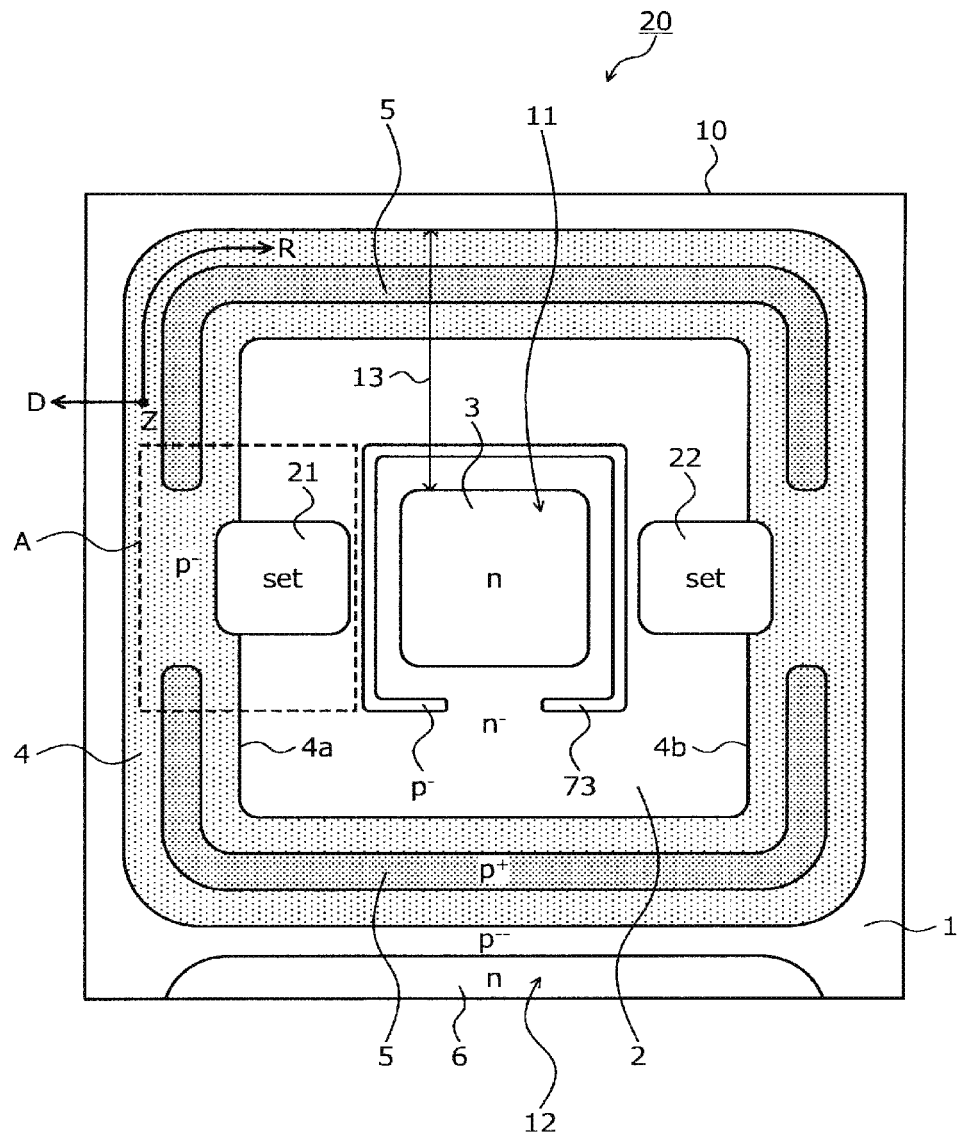
FIG. 4C is a plan view of the planar layout of a semiconductor device of Embodiment 5.

Next, the structure of a semiconductor device according to Embodiment 5 will be explained. FIG. 4C is a plan view of the planar layout of the semiconductor device of Embodiment 5. The semiconductor device of Embodiment 5 differs from the semiconductor device of Embodiment 4 in the arrangement of a p⁻ slit region 73. Specifically, the p⁻ slit region 73 is provided in the n⁻ diffusion region 2 so as to surround the n-type diffusion region 3.

The p⁻ slit region 73 is provided in the n⁻ diffusion region 2 in a roughly C-shaped planar layout (a roughly rectangular shape with an open portion) and surrounds the n-type diffusion region 3. The p- slit region 73 is provided at a depth that reaches the p⁻⁻ substrate region 1 in the depth direction from the front surface of the semiconductor substrate 10. In other words, the n⁻ diffusion region 2 is isolated from the n-type diffusion region 3 in the portion where the p⁻ slit region 73 is disposed.

Although not shown in the drawings, the p- slit region 73 is provided only in the n-type diffusion region 3. In this case, the p⁻ slit region 73 is disposed in a roughly C-shaped planar layout surrounding the center portion of the n-type diffusion region 3.

The p⁻ slit region 73 becomes depleted when a high voltage is applied to the n⁺ drain region 34 of the HVNMOSes 21, 22 (for example, when, in the circuit of FIG. 5, the upper arm IGBT 121 turns ON and the potential of the AC output terminal OUT becomes approximately the power supply potential Vdc of the bridge circuit 120).

As described above, Embodiment 5 can obtain similar effects to Embodiments 1 to 4. In Embodiment 5, even if a high voltage were to be applied to the n⁺ drain region of the HVNMOS, the p⁻ slit region surrounding the n-type diffusion region would deplete, thus ensuring the withstand voltage.

Various modifications can be made to the embodiments of the present invention described above without departing from the spirit of the present invention. For example, the p⁺ common potential regions and source contact region and p-type back gate region of the HVNMOS may be connected by diffusion resistors (or substrate resistors) in the p⁻ isolation region, or the positional relationship (planar layout) of the p⁺ common potential regions and source contact region & p-type back gate region of the HVNMOS can be modified. Furthermore, in the respective embodiments described above, an example was described of a gate driver IC that drives a power device, but the present invention is also applicable to various circuits that use MOSFETs of a source follower configuration. The present invention exhibits the same effects even if the conductivity type (n-type, p-type) is inverted.

As described above, the semiconductor device of the present invention is useful as a semiconductor device that is used in a power converter such as an inverter, a power supply device used in various types of industrial machinery or the like, etc.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor substrate of a first conductivity type;
   a first semiconductor region of a second conductivity type, selectively provided in one main surface of the semiconductor substrate;
   an isolating structure formed by a pn junction of the semiconductor substrate and the first semiconductor region, the isolating structure isolating regions of differing potentials;
   a semiconductor element having: a second semiconductor region of the second conductivity type, selectively provided in the one main surface of the semiconductor substrate so as to be separated from the first semiconductor region and electrically connected to an electrode of a minimum potential through a first resistor; a third semiconductor region of the second conductivity type selectively provided inside the first semiconductor region and having a higher impurity concentration than the first semiconductor region; a gate insulating film provided along the semiconductor substrate between the first semiconductor region and the second semiconductor region; and a gate electrode provided along the gate insulating film, the semiconductor element converting a signal referenced to the minimum potential into a signal referenced to a potential differing from the minimum potential; and
   a fourth semiconductor region of the first conductivity type selectively provided in the one main surface of the semiconductor substrate so as to be separated from the second semiconductor region at a prescribed distance and electrically connected to the electrode of the minimum potential, the fourth semiconductor region having a higher impurity concentration than the semiconductor substrate,
   wherein the second semiconductor region is electrically connected to the fourth semiconductor region through a second resistor, and
   wherein the second resistor comprises a portion of the semiconductor substrate between the second semiconductor region and the fourth semiconductor region.

2. The semiconductor device according to claim 1, further comprising:
   a fifth semiconductor region of the first conductivity type, selectively provided in the one main surface of the semiconductor substrate and contacting the first semiconductor region, the fifth semiconductor region having a higher impurity concentration than the semiconductor substrate,
   wherein the isolating structure is formed by a pn junction of the fifth semiconductor region and the first semiconductor region,
   wherein the second semiconductor region and the fourth semiconductor region are provided inside the fifth semiconductor region,
   wherein the gate insulating film is provided along the fifth semiconductor region between the first semiconductor region and the second semiconductor region, and
   wherein the second resistor comprises a portion of the fifth semiconductor region between the second semiconductor region and the fourth semiconductor region.

3. The semiconductor device according to claim 2, further comprising:
   a back-gate region of the first conductivity type, selectively provided inside the first semiconductor region and contacting a portion of the fifth semiconductor region between the second semiconductor region and the fourth semiconductor region, the back-gate region having a higher impurity concentration than the fifth semiconductor region,
   wherein the second semiconductor region between the second semiconductor region and the fourth semiconductor region, and
   wherein the gate insulating film is provided along the back-gate region between the first semiconductor region and the second semiconductor region.

4. The semiconductor device according to claim 3, further comprising: a diffusion region of the second conductivity type, selectively provided in a portion of the fifth semiconductor region between the second semiconductor region and the fourth semiconductor region.

5. The semiconductor device according to claim 4, wherein a potential of the diffusion region is a floating potential or a power supply potential.

6. The semiconductor device according to claim 3, further comprising: a diffusion region of the second conductivity type, selectively provided in a portion of the fifth semiconductor region between the second semiconductor region and the fourth semiconductor region, the diffusion region being electrically connected to the back-gate region.

7. The semiconductor device according to claim 3,
   wherein the semiconductor element is disposed along the pn junction that forms the isolating structure, and
   wherein, in the one main surface of the semiconductor substrate, the fourth semiconductor region does not face the second semiconductor region in a direction perpendicular to a pn junction interface of the pn junction that forms the isolating structure along which the semiconductor element is disposed.

8. The semiconductor device according to claim 2, further comprising: a diffusion region of the second conductivity type, selectively provided in a portion of the fifth semiconductor region between the second semiconductor region and the fourth semiconductor region.

9. The semiconductor device according to claim 8, wherein a potential of the diffusion region is a floating potential or a power supply potential.

10. The semiconductor device according to claim 2,
wherein the semiconductor element is disposed along the pn junction that forms the isolating structure, and
wherein, in the one main surface of the semiconductor substrate, the fourth semiconductor region does not face the second semiconductor region in a direction perpendicular to a pn junction interface of the pn junction that forms the isolating structure along which the semiconductor element is disposed.

11. The semiconductor device according to claim 1, further comprising:
a back-gate region of the first conductivity type, selectively provided inside the first semiconductor region and contacting a portion of the semiconductor substrate between the second semiconductor region and the fourth semiconductor region, the back-gate region having a higher impurity concentration than the semiconductor substrate,
wherein the second semiconductor region is provided inside the back-gate region and contacts a portion of the semiconductor substrate between the second semiconductor region and the fourth semiconductor region, and
wherein the gate insulating film is provided along the back-gate region between the first semiconductor region and the second semiconductor region.

12. The semiconductor device according to claim 11, further comprising: a diffusion region of the second conductivity type, selectively provided in a portion of the semiconductor substrate between the second semiconductor region and the fourth semiconductor region, the diffusion region being electrically connected to the back-gate region.

13. The semiconductor device according to claim 11,
wherein the semiconductor element is disposed along the pn junction that forms the isolating structure, and
wherein, in the one main surface of the semiconductor substrate, the fourth semiconductor region does not face the second semiconductor region in a direction perpendicular to a pn junction interface of the pn junction that forms the isolating structure along which the semiconductor element is disposed.

14. The semiconductor device according to claim 1, further comprising: a diffusion region of the second conductivity type, selectively provided in a portion of the semiconductor substrate between the second semiconductor region and the fourth semiconductor region.

15. The semiconductor device according to claim 14, wherein a potential of the diffusion region is a floating potential or a power supply potential.

16. The semiconductor device according to claim 14,
wherein the semiconductor element is disposed along the pn junction that forms the isolating structure, and
wherein, in the one main surface of the semiconductor substrate, the fourth semiconductor region does not face the second semiconductor region in a direction perpendicular to a pn junction interface of the pn junction that forms the isolating structure along which the semiconductor element is disposed.

17. The semiconductor device according to claim 1, wherein the first resistor is a resistive element connected in parallel to the second resistor.

18. The semiconductor device according to claim 17, wherein a resistance of the second resistor is higher than a resistance of the first resistor.

19. The semiconductor device according to claim 1, wherein the second resistor is used as the first resistor.

20. The semiconductor device according to claim 1,
wherein the semiconductor element is disposed along the pn junction that forms the isolating structure, and
wherein, in the one main surface of the semiconductor substrate, the fourth semiconductor region does not face the second semiconductor region in a direction perpendicular to a pn junction interface of the pn junction that forms the isolating structure along which the semiconductor element is disposed.

* * * * *

UNITED STATES PATENT AND TRADEMARK OFFICE
CERTIFICATE OF CORRECTION

PATENT NO. : 10,192,870 B2
APPLICATION NO. : 15/831778
DATED : January 29, 2019
INVENTOR(S) : Masaharu Yamaji Page 1 of 2

It is certified that error appears in the above-identified patent and that said Letters Patent is hereby corrected as shown below:

In the Specification

Column 3, Line 43, the text "a current Jr suppplied" should be changed to -- a current Ir supplied --.

Column 4, Line 25, the text "the n¯ diffusion" should be changed to -- the n¯¯ diffusion --.
Column 4, Lines 30, 33, 58, and 59, the text "then diffusion", each occurrence, should be changed to -- the n¯ diffusion --.

Column 5, Line 6, the text "Then diffusion" should be changed to -- The n¯ diffusion --.
Column 5, Line 27, the text "and p¯ substrate" should be changed to -- and p¯¯ substrate --.
Column 5, Lines 14 and 57, the text "then diffusion", each occurrence, should be changed to -- the n¯ diffusion --.

Column 10, Line 6, the text "Then diffusion" should be changed to -- The n¯ diffusion --.
Column 10, Line 25, the text "then diffusion" should be changed to -- the n¯ diffusion --.

Column 11, Lines 5 and 8, the text "then diffusion", each occurrence, should be changed to -- the n¯ diffusion --.

Column 13, Line 26, the text "then diffusion" should be changed to -- the n¯ diffusion --.

Column 15, Lines 9 and 41, the text "then diffusion", each occurrence, should be changed to -- the n¯ diffusion --.
Column 15, Lines 24 and 28, the text "the p¯ substrate", each occurrence, should be changed to -- the p¯¯ substrate --.
Column 15, Lines 45, 51, and 56, the text "then epitaxial", each occurrence, should be changed to -- the n¯ epitaxial --.
Column 15, Line 54, the text "the n epitaxial" should be changed to -- the n¯ epitaxial --.
Column 15, Line 63, the text "Then isolation" should be changed to -- The n¯ isolation --.

Signed and Sealed this
Second Day of April, 2019

Andrei Iancu
*Director of the United States Patent and Trademark Office*

Column 19, Line 50, the text "then diffusion" should be changed to -- the n⁻ diffusion --.

Column 20, Line 11, the text "then diffusion" should be changed to -- the n⁻ diffusion --.

In the Claims

Column 22, Line 31, after "wherein the second semiconductor region" and before "between the", following texts should be inserted:
-- is provided inside the back-gate region and contacts a portion of the fifth semiconductor region --.